(12) United States Patent
Cheah et al.

(10) Patent No.: US 12,717,365 B2
(45) Date of Patent: Aug. 25, 2026

(54) SYSTEM AND METHOD FOR VIRTUAL RESISTANCE

(71) Applicant: NATIONAL INSTRUMENTS CORPORATION, Austin, TX (US)

(72) Inventors: Chin-Hong Cheah, Gelugor (MY); Tatt-Wee Oong, Georgetown (MY); Hao-Jie Chan, Bayan Lepas (MY); Siew-Leong Lam, Bayan Lepas (MY)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 76 days.

(21) Appl. No.: 18/817,742

(22) Filed: Aug. 28, 2024

(65) Prior Publication Data

US 2025/0076907 A1 Mar. 6, 2025

Related U.S. Application Data

(60) Provisional application No. 63/579,400, filed on Aug. 29, 2023.

(51) Int. Cl.
*G05F 1/56* (2006.01)
*G01R 19/00* (2006.01)

(52) U.S. Cl.
CPC .......... *G05F 1/56* (2013.01); *G01R 19/0084* (2013.01)

(58) Field of Classification Search
CPC ............................ G05F 1/56; G01R 19/0084
See application file for complete search history.

(56) References Cited

U.S. PATENT DOCUMENTS 9,651,957 B1 5/2017 Finley
10,186,962 B2 1/2019 Matsuura et al.
10,345,838 B1 * 7/2019 Karadi .................... G05F 1/575
2009/0119519 A1 * 5/2009 McDonald ............... G06F 1/26 713/300
2011/0037448 A1 * 2/2011 Liu ...................... H02M 3/158 323/284
2017/0316811 A1 * 11/2017 Benedict ............... G11C 5/147

FOREIGN PATENT DOCUMENTS

CN 106992699 A 7/2017

* cited by examiner

*Primary Examiner* — Daniel C Puentes
(74) *Attorney, Agent, or Firm* — Kowert, Hood, Munyon, Rankin & Goetzel, P.C.; Jeffrey C. Hood; Luke Langsjoen

(57) ABSTRACT

A control system exhibits improved dynamic performance in a constant voltage (CV) control mode that is also invariant of the source type and operating points. The improvements may be achieved with minimal or potentially no additional parts to the control circuit by replacing a voltage-controlled current source with a voltage-controlled resistance as the control element in the system feedback loop. An input voltage from a device under test (DUT) is measured, a feedback control voltage is determined based at least in part on the input voltage to provide a CV mode control loop for the DUT, and the feedback control voltage added to the input voltage is applied to the DUT to operate the DUT in the CV mode.

20 Claims, 32 Drawing Sheets

Isource
402
Rnorton
404

Rnorton High (DUT=more ideal current source)
502
504
Current source
becomes more ideal
506
20db/dec slope
508
Rnorton Low (DUT=less ideal current source)
Gain/dB
180
160
140
120
100
80
60
40
20
1m
10m
100m
1
5
10
100
1k
10k
100k
1M
10M
Frequency/Hz
1MHz/div For CV+R Source => 2904, 2910

For CC Source => 2906, 2908

Figure 31:
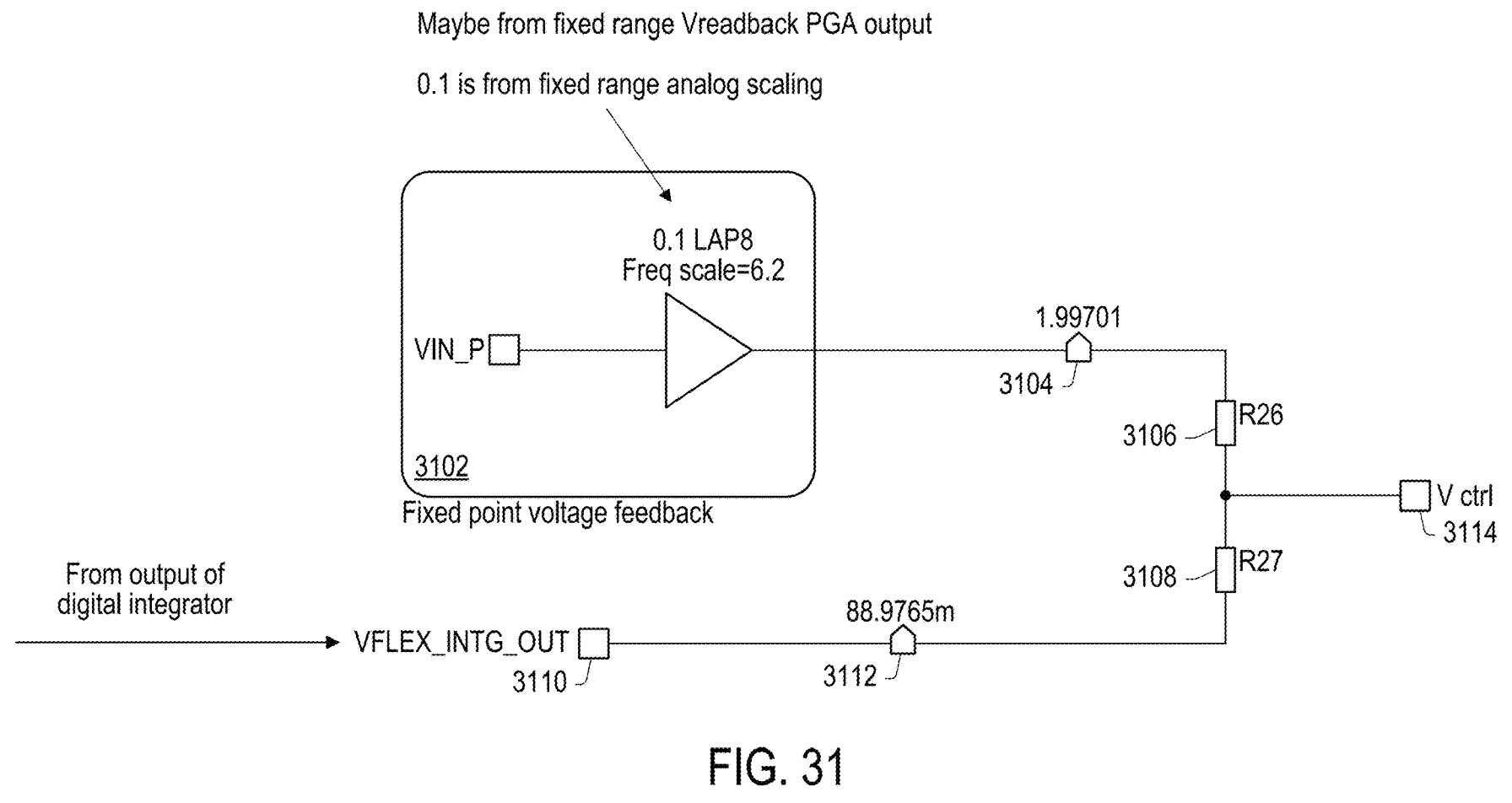

Maybe from fixed range Vreadback PGA output 0.1 is from fixed range analog scaling 0.1 LAP8
Freq scale=6.2

VIN_P

3102

Fixed point voltage feedback 1.99701

3104

R26

3106

V ctrl

3114

R27

3108

From output of
digital integrator

VFLEX_INTG_OUT

SYSTEM AND METHOD FOR VIRTUAL RESISTANCE

PRIORITY INFORMATION

This application claims the benefit of priority to U.S. Provisional Application No. 63/579,400, titled "System and Method for Virtual Resistance", and filed on Aug. 29, 2023, which is hereby incorporated by reference in its entirety, as though fully and completely set forth herein.

BACKGROUND OF THE INVENTION

Field of the Invention

This invention relates to measurement and data acquisition systems, including a system and method for virtual resistance that enables operating-point-invariable dynamic performance and adjustable compensation for cable inductance.

Description of the Related Art

Measurement systems are oftentimes used to perform a variety of functions, including measurement of physical phenomena, measurement of certain characteristics or operating parameters of a unit under test (UUT) or device under test (DUT), testing and analysis of physical phenomena, process monitoring and control, control of mechanical or electrical machinery, data logging, laboratory research, and analytical chemistry, to name a few examples.

Process monitoring and control typically involves a control system, which manages, commands, directs, or regulates the behavior of other devices or systems using control loops. Control systems may include closed-loop controllers and/or open-loop controllers. A closed-loop controller, or feedback controller incorporates feedback, in contrast to an open-loop controller. A closed-loop controller uses feedback to control states or outputs of a dynamical system. Process inputs (e.g., voltage applied to an electric motor) have an effect on the process outputs (e.g., speed or torque of the motor), which is measured with sensors and processed by the controller, with a resulting control signal fed back as input to the process control, thereby closing the loop. Control modes include constant voltage (CV) control and constant current (CC) control. In some control systems, CV control and CC control of an electronic load may become problematic in case a single control element, typically a voltage controlled current source, is used as the primary control element when the electronic load switches from CC control mode to CV control mode.

Other corresponding issues related to the prior art will become apparent to one skilled in the art after comparing such prior art with the present invention as described herein.

SUMMARY OF THE INVENTION

Embodiments are presented herein of a system and method to improve dynamic performance in constant voltage (CV) control mode that is invariant of the source type and operating points. Furthermore, in constant current (CC) mode the resonance of the cable inductance may be reduced or eliminated without any snubber elements or changes to the control elements of the electronic load, thereby yielding higher bandwidth and response speed than what has been traditionally achieved when cable inductance/resonance is high. The improvements may be achieved with minimal or potentially no additional parts to the control circuit as will be further described herein.

In some embodiments, an input voltage from a device under test (DUT) is measured.

In some embodiments, a feedback control voltage is determined based at least in part on the input voltage to provide a constant voltage (CV) mode control loop for the DUT.

In some embodiments, the feedback control voltage added to the input voltage is applied to the DUT to operate the DUT in a CV mode.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The foregoing, as well as other objects, features, and advantages of this invention may be more completely understood by reference to the following detailed description when read together with the accompanying drawings in which:

FIG. 31 shows a simplified example circuit diagram of a simple resistor implementation of a voltage-controlled resistance, according to some embodiments;

Figure 2:
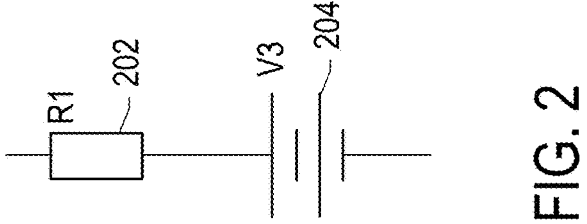
FIG. 2 shows a simplified circuit diagram of an example device under test (DUT) operating as a constant voltage (CV) source with a resistor in series.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Terms

The following is a glossary of terms that may appear in the present disclosure:

Memory Medium—Any of various types of non-transitory memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer system in which the programs are executed, or may be located in a second different computer system which connects to the first computer system over a network, such as the Internet. In the latter instance, the second computer system may provide program instructions to the first computer system for execution. The term "memory medium" may include two or more memory mediums which may reside in different locations, e.g., in different computer systems that are connected over a network. The memory medium may store program instructions (e.g., embodied as computer programs) that may be executed by one or more processors.

Computer System (or Computer)—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" may be broadly defined to encompass any device (or combination of devices) having at least one processor that executes instructions from a memory medium.

Processing Element (or Processor)—refers to various elements or combinations of elements that are capable of performing a function in a device, e.g., in a user equipment device or in a cellular network device. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations of the above.

Configured to—Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

SMU—Source Measurement Unit—an instrument that combines a sourcing function and a measurement function on the same pin or connector. An SMU may source voltage and/or current and may simultaneously measure voltage and/or current.

TOF sensing—Time of Flight sensing—the measurement of the time taken by an object, particle or wave to travel a distance.

Plant—A plant in control theory refers to the combination of process and actuator. A plant is typically modeled as a transfer function (commonly in the s-domain) and defines the relationship between an input signal and the corresponding output signal of a system, without taking feedback into consideration. The plant is generally determined by physical properties of the system. In a system with feedback, the plant remains the same transfer function while a control unit and a feedback loop, which are each characterized by their own respective transfer functions, are also added to the system.

FPGA—Field Programmable Gate Array; an integrated circuit designed to be configured after manufacturing. The FPGA configuration is generally specified using a hardware description language (HDL), similar to that used for an application-specific integrated circuit (ASIC).

DUT—Device Under Test

Various components may be described as performing a task or tasks, for convenience in the description. Such descriptions should be interpreted as including the phrase "configured to." Reciting a component that is configured to perform one or more tasks is expressly intended not to invoke a 35 U.S.C. § 112(f) interpretation for that component.

Control System Issues

As previously mentioned, in many control systems, the control of Constant Voltage (CV) and Constant Current (CC) mode of an electronic load can be particularly problematic because a single control element, typically a voltage controlled current source is used as the primary control element when the electronic load switches from CC mode to CV mode. This presents a challenge in the CV mode as the conversion of a voltage-controlled current source into a voltage-controlled voltage source results in a CV mode in the electronic load whose performance becomes dependent on the type of source that is connected to it. Compensation to optimize for a particular type of source will result in instability or poor performance on the other types of sources, and there may not be a 'one size fits all' compensation that will prove optimal. Also, the control performance and compensation requirements are very dependent on the particular operating mode such as current level and voltage level being commanded, again resulting in poor performance if compensation is for a particular operating point while other nodes are expected to remain stable.

In CC mode, other issues may also arise. In the typical control system where a direct traditional control method is used via a single integrator and perhaps some compensation, the cable inductance causes resonance that will limit the dynamic performance of the CC operational mode. To address this, the control system is typically compensated for a reasonable cable length, which may result in poor performance, or it may involve the use of methods like RC snubbers (capacitance with series resistor) which distort the waveforms and dissipate power to reduce the resonance. In addition, using RC snubbers may only function effectively to a predetermined maximum cable inductance decided at design time.

As a result, most of the electronic loads available today are characterized by poor (slow) dynamic performance in CV mode, and either have similarly poor performance in CC mode or require snubber components that affect the performance when the same snubber values are not altered/switched when operating in CV mode. The presence of these snubbers also distorts the current-waveform provided to the control elements. In addition, snubbers are not adjustable or have limited adjustment by switching values into the snubber circuit, which makes them optimized for a particular maximum cable inductance (in CC mode) and for a particular set of V and I operating points and source type (in CV mode).

In various embodiments, the above referenced issues may be overcome, and a vastly improved dynamic performance may be obtained in CV mode, providing a solution unaffected by the source type and operating points. Furthermore, the resonance of the cable inductance may be reduced or eliminated in CC mode without any snubber elements or changes to the primary controlling plant circuitry of the electronic load, thereby yielding higher bandwidth and response speed than traditionally achieved when cable inductance/resonance is high. In some embodiments, the above improvements may be achieved with minimal or potentially no additional parts to the control circuitry, as will be further described herein.

Present CV Solutions

Figure 1:
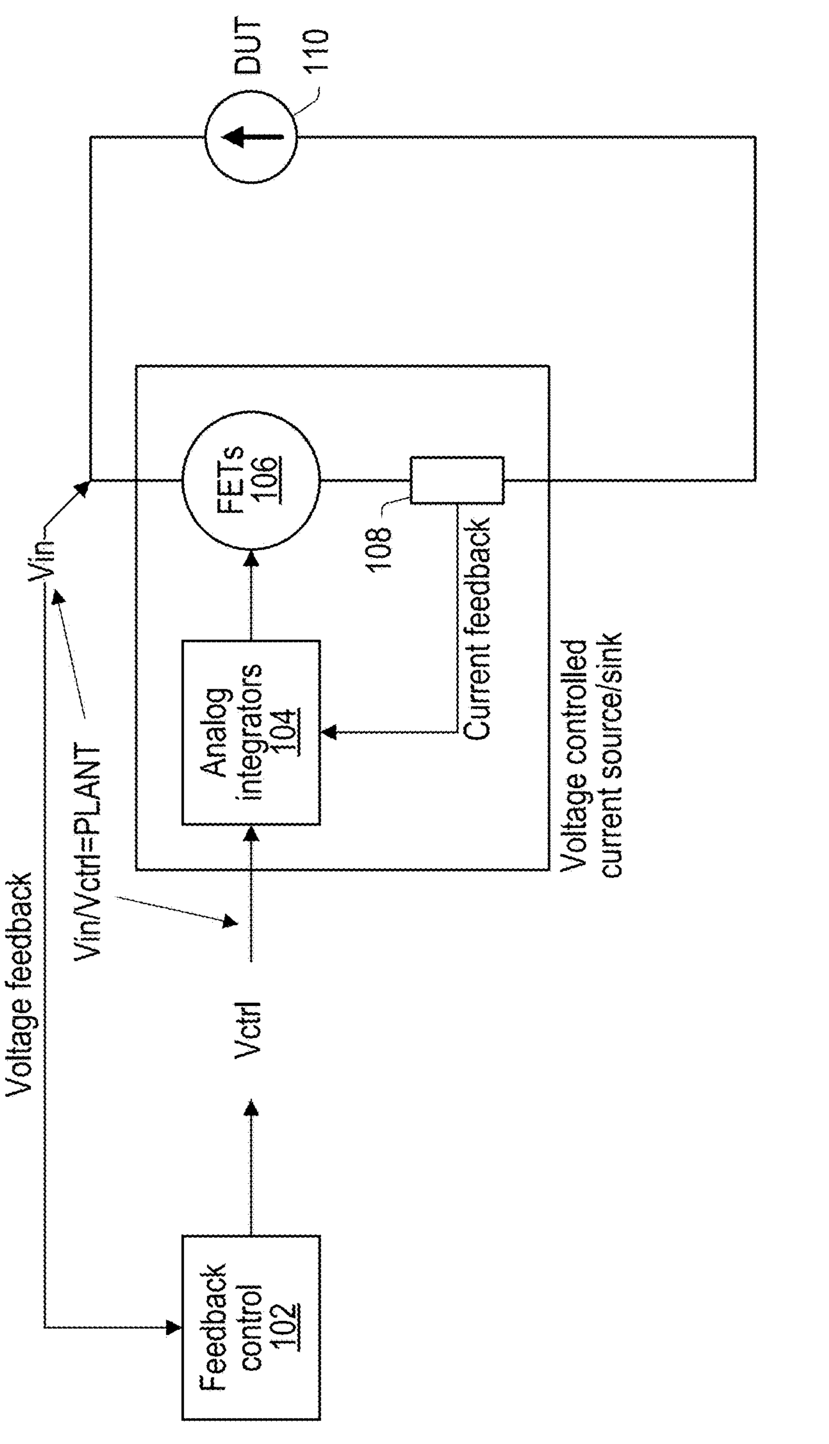
FIG. 1 shows a simplified circuit diagram of an example measurement system with a voltage-controlled current source/sink, according to prior art.

FIG. 1 shows an example circuit of control system with electronic load configured in CV mode. As shown in FIG. 1, DUT 110 represents a typical electronic load operating in CV mode. Input voltage of the DUT is fed back and processed via feedback control to convert the voltage-controlled current source/sink into a voltage-controlled voltage sink/shunt. This way, the same element that is used for CC mode may also be used for voltage control of the DUT in CV mode. The effects of the DUT changing from one type to another is further discussed below.

DUT is a CV Source with a Series Resistor

Figure 3:
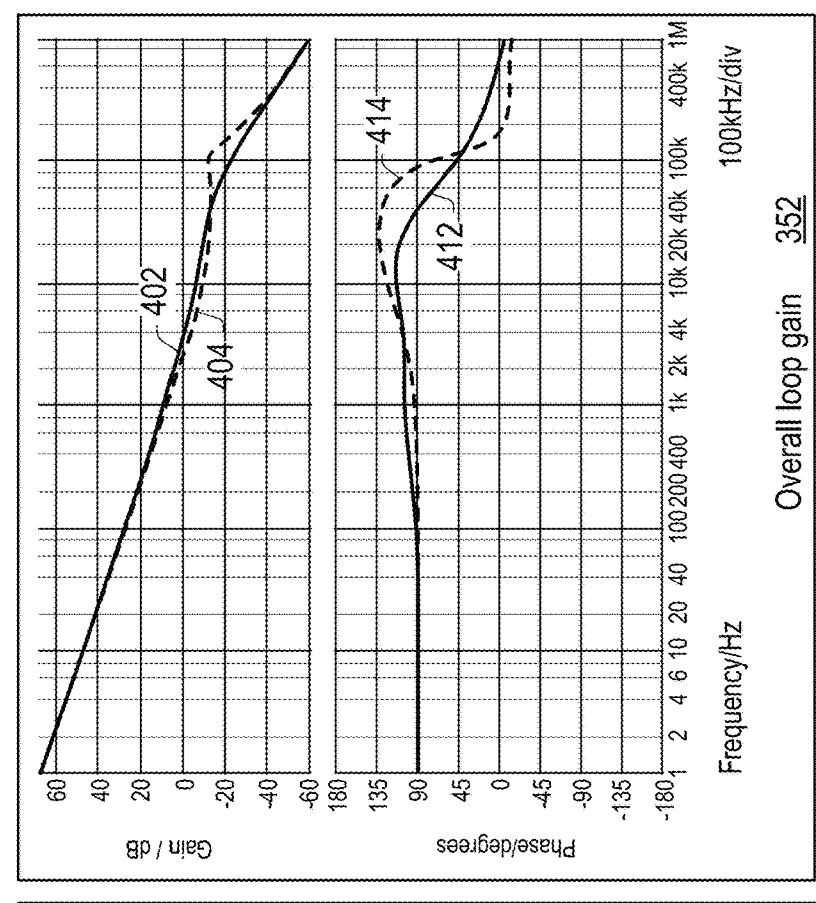
FIG. 3 shows example bode plots, respectively, of a plant and control loop representative of the circuit of FIG. 1.
Figure 3:
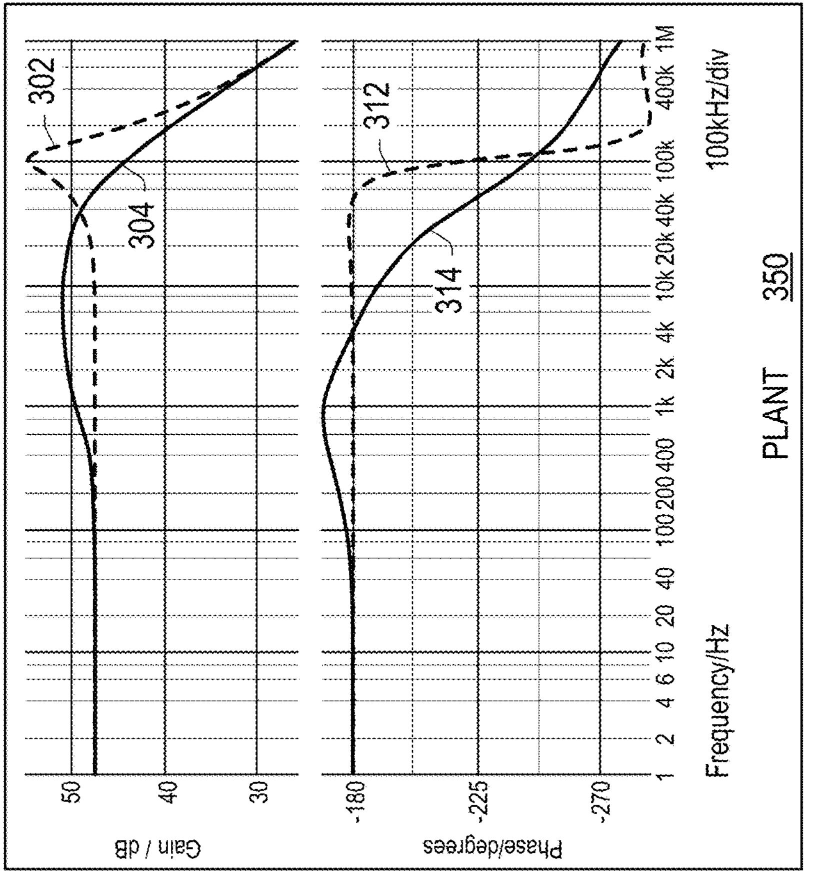

When the DUT operates as a CV source with a resistor in series as illustrated in FIG. 2, the CV basically works in a simple manner. This is because with a CV source the voltage-controlled current source feedback loop can still control the input current, and by varying Vctrl it is able to adjust the input current such that the input voltage Vin is regulated. Basically, the FET becomes part of a resistor divider network with the DUT's series resistor. Although with a slightly different bandwidth, the loop gain of both the feedback loop and the plant (Plant=Vin/Vctrl) looks similar to that in current mode as illustrated by the example bode plots in FIG. 3. The feedback loop integrator shows the typical 20 db/dec slope with a 90 degree phase margin until it completely decays. The total bandwidth is different from CC mode but the shape and the required compensation are essentially the same. There are no discernible issues present, until the type of source is changed, as discussed in the next section.

DUT is a CC Source

Figures 4, 5:
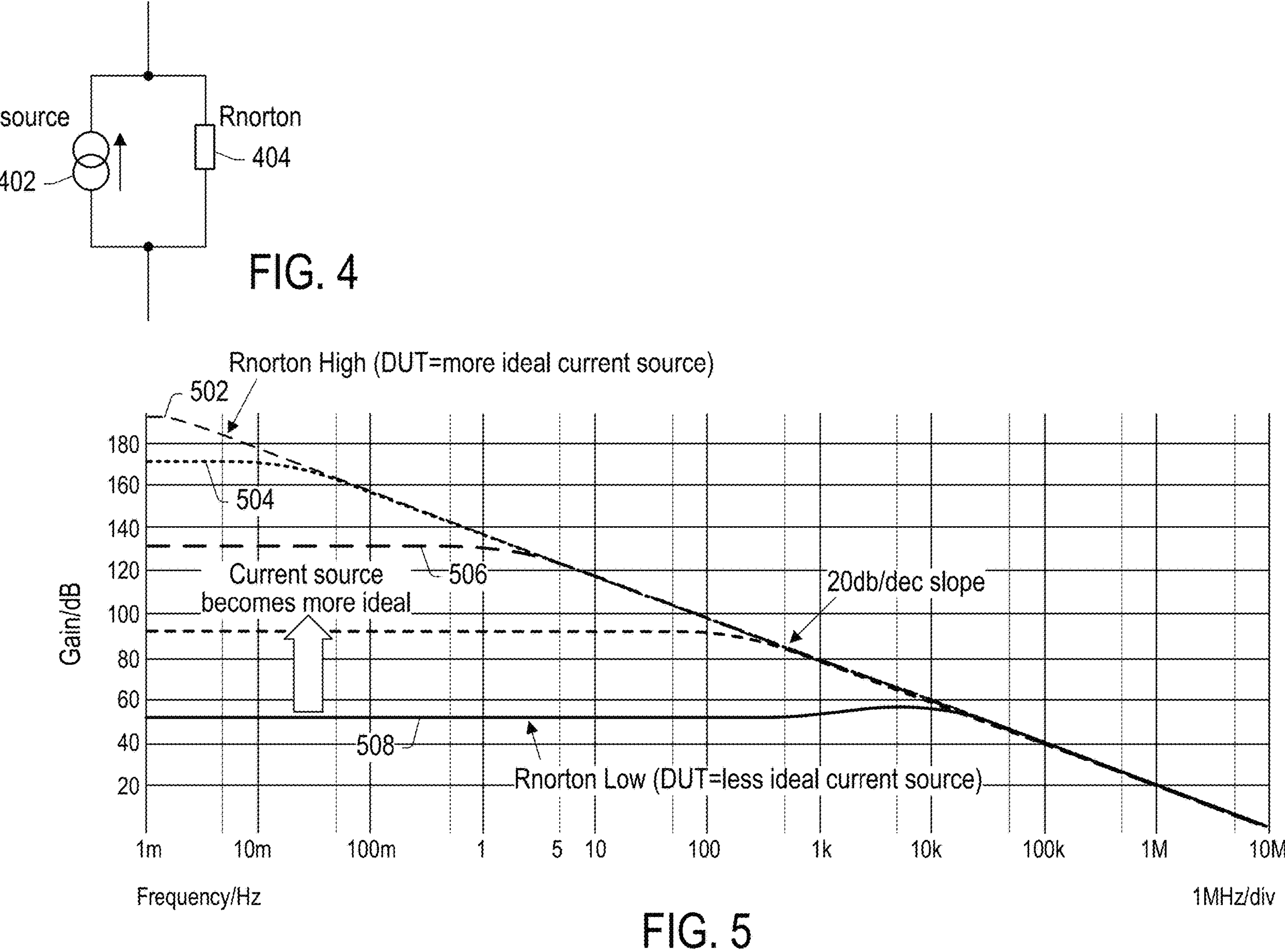
FIG. 4 shows a simplified circuit diagram of an example DUT operating as a constant current (CC) source.
FIG. 5 shows an example bode plot of a plant's gain with a CC source.
Figure 6:
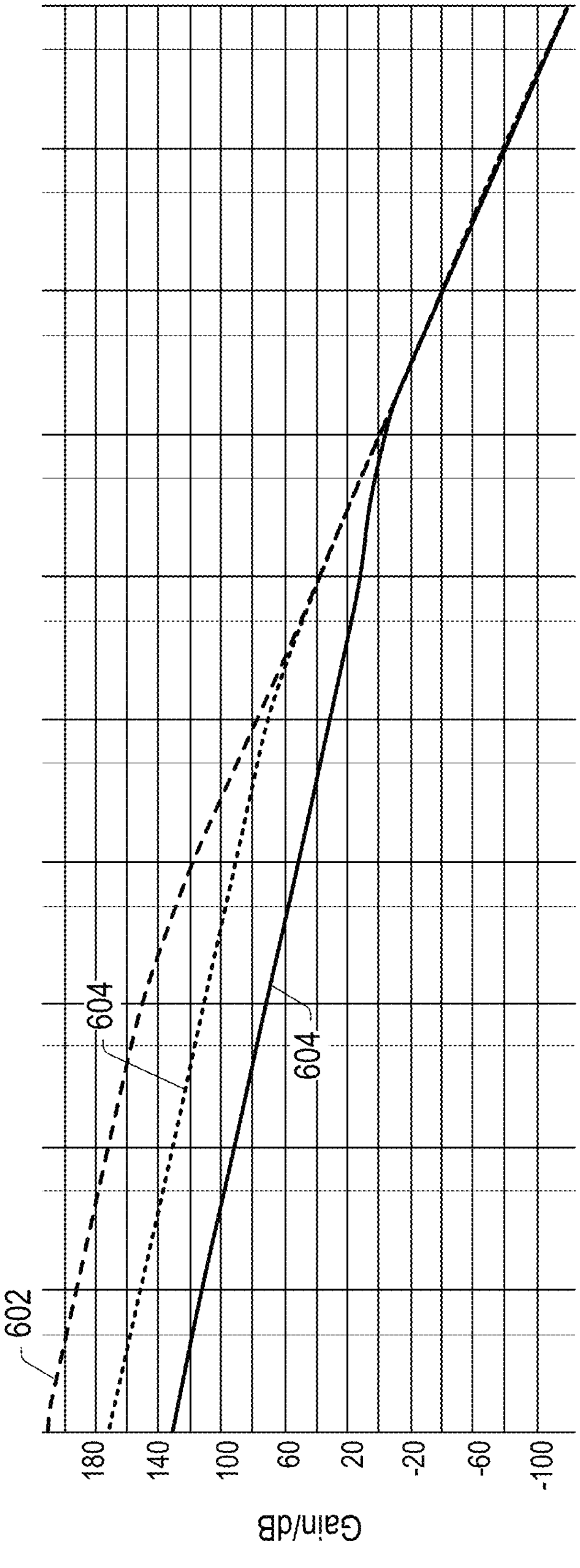
FIG. 6 shows an example bode plot illustrating loop gain gain-bandwidth with a feedback loop integrator completing the control loop.

Various issues may arise when the DUT operates as a CC source with an equivalent resistance, (Rnorton, where Rnorton will increase toward infinity as the constant current source becomes more ideal), depending on how ideal the current source is, as illustrated in FIG. 4. FIG. 5 shows an example bode plot of a plant's gain with a CC source, illustrating transition to a 20 db/dec slope point as the equivalent resistance Rnorton changes. FIG. 5 provides an illustration of the plant's gain (again Vin/Vctrl) when the input of the electronic load is connected to a CC source. The slope is a 20 db slope with voltage sense feedback/input, which means that there is basically no phase margin once the loop is closed with the main voltage feedback loop which has an integrator. The integrator adds another 20 db/decade to the slope, making it 40 db/decade with a total of 180 degree phase-shift. This essentially results in no phase margin or instability, as shown in the example plot of the Loop Gain DGBW with additional FlexLoop integrator, in FIG. 6. The point where the 20 db per decade (or where it becomes 40 db/decade in the overall loop gain with flexloop's integrator) depends on the ideality of the current source (or how high the equivalent resistance, Rnorton is). The more ideal the current source, the earlier the 40 db/decade slope starts rendering the system unstable from low frequencies, making it harder to compensate the system.

Effect of Snubbers (Capacitance with Series Resistor) at the Input

Figure 7:
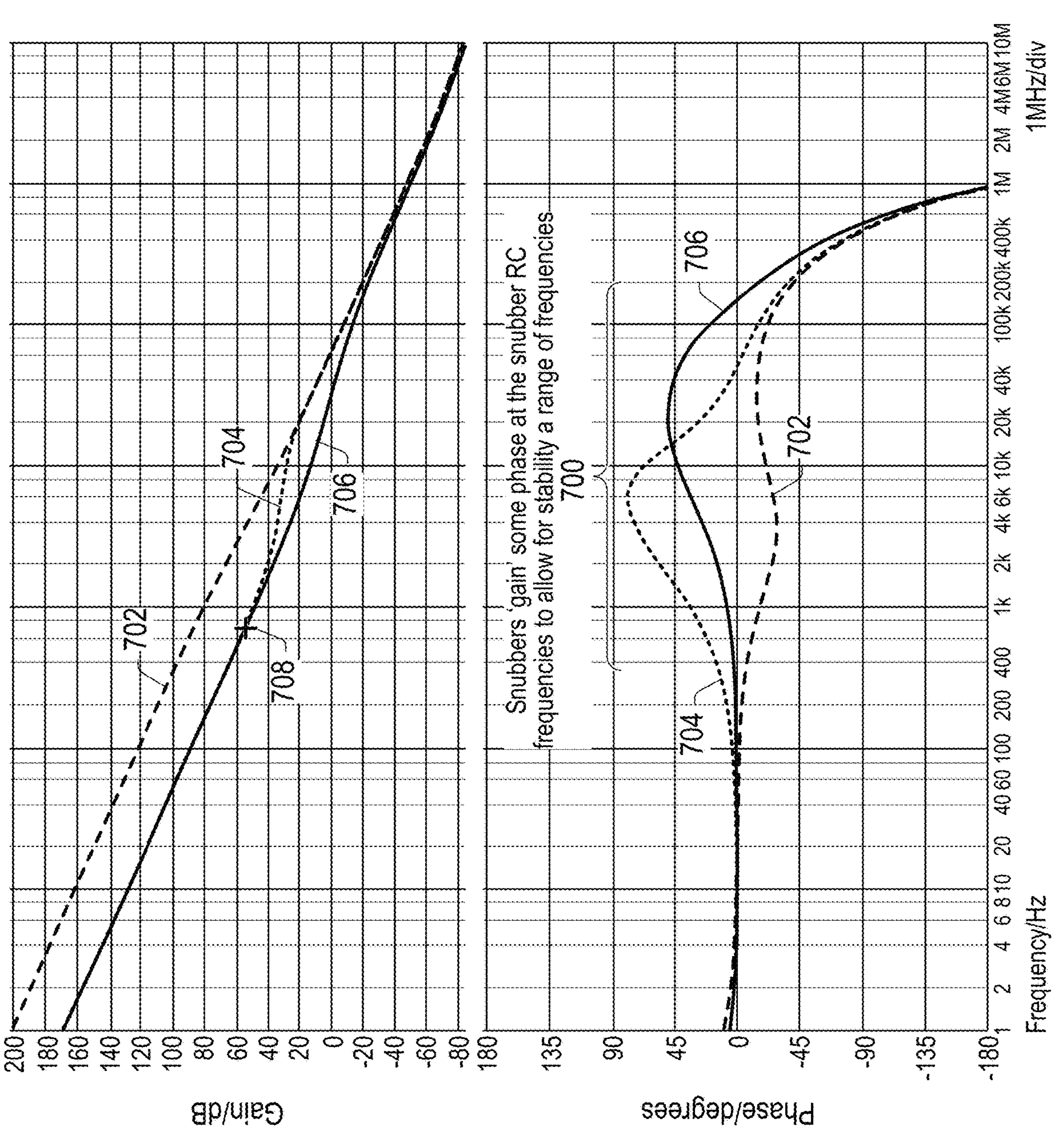
FIG. 7 shows example bode plots, respectively, for gain and phase of a system featuring snubbers.

FIG. 7 shows an example bode plot illustrating the gain and phase of the system with the use of snubbers. A snubber improves margin and allows for stability at a range of crossover frequencies (bandwidth). One method that has been used to gain additional margin with a CC Source is the addition of a snubber circuit, which is essentially a capacitor and resistor in series. The snubber is coupled in parallel to the CC Source (typically across the inputs of the electronic load—built into the design). As illustrated in FIG. 7, a snubber may achieve some phase margin gains starting from a given frequency. By playing with the values of the R and C in the snubber, the range may be widened where there is phase gain for stability—however there will be no phase margin at low frequencies, all the way to DC. Additionally, a large capacitance in the snubber may suffer from detrimental large-signal issues as will be further described later.

This means that the loop should not be closed at too low a frequency. However, either because the operating point changes the overall gain of the loop gain, or because of the intent to make this gain adjustable, the system may become unstable when the bandwidth gets lower. This may be considered counterintuitive, as additional stability may be expected when the bandwidth is reduced. This also means that there may be a minimum usable bandwidth (or usable slew rates), which again may be considered counterintuitive as instability is expected only when bandwidth is too high, not at the low end.

Figure 8:
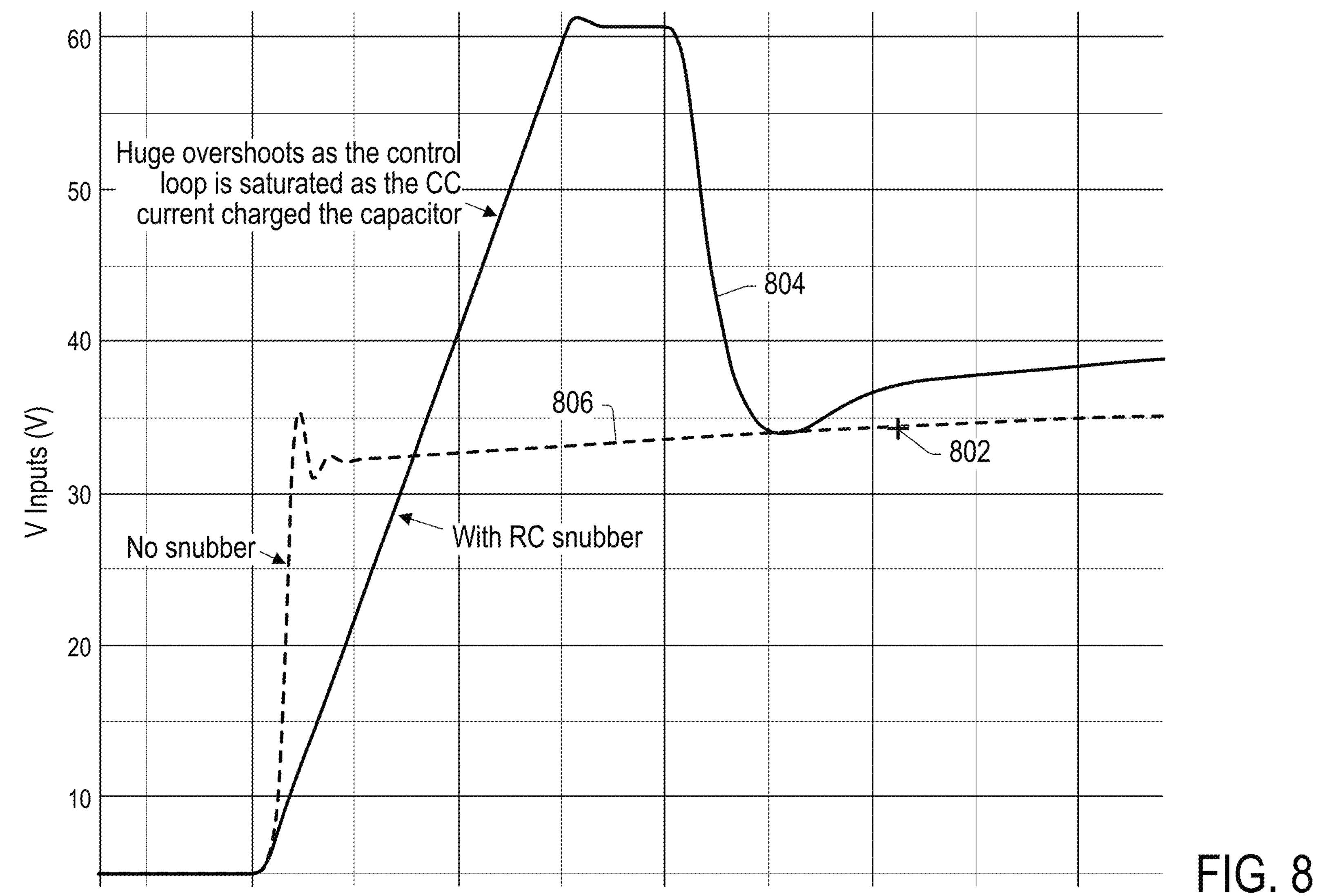
FIG. 8 shows an example voltage diagram illustrating voltage response for a system featuring snubbers, for low CC source.

One more issue with having a snubber is the case where the CC source current is too low and cannot charge up the snubber capacitance as fast as would be required by the control loop during a voltage step. This causes the control loop to go into saturation and wait for the linear charging of the snubber capacitor until the voltage reaches the desired step setpoint. This raises two issues. First, it slows down the control loop rise response of a voltage step. Second, due to saturation of the control loop, there will be an overshoot of the voltage step until the control loop comes out of saturation and regains linear control. This overall effect is illustrated in FIG. 8, which shows an example waveform representation of a slow uncontrolled response with snubber when the CC source current is low. With a snubber, when the loop is closed at both curves (shown in FIG. 7) at similar operating points (or close), both have enough margins to remain stable. However, the use of snubbers may still raise the following issues:

- There may be an error in AC current waveform measurement due to the effect of the snubber, which may lead to likely errors in RMS etc.
- The C and R combination that works for CV mode need not be the one that is optimized when we moving to CC mode, so another set of compromises may be required.
- While not shown in FIG. 7, the gain of the loop-gain changes with operating points of either voltage or current, yielding another set of compromises which may lead to poor performance.
- In addition to a snubber, some electronic loads may have two separate compensations which may be manually selected for the different DUTs. This provides more flexibility and a more optimized response but requires knowledge of the type of source that is connected to the electronic load.
- The lack of margins (instability) at lower bandwidth is problematic when operating points shift the GBW (gain bandwidth product) and cause the bandwidth to be reduced, resulting in oscillations when the bandwidth is reduced to certain frequencies (where the margin disappears). This may seem counterintuitive when considering typical control systems where the bandwidth may be reduced to gain stability. This creates a sort of bandpass ensured stability, which is undesirable in most control systems, especially one like an electronic load where the operating point is user adjustable (resulting in potential shifts in bandwidth into the low frequency instability region).
- When CC source current is low, the large signal response to a voltage step is slow and causes the control loop to momentarily saturate.
- The R in the snubber typically needs to be large(er) compared to that required for actual snubbing when operating in CC mode). Also, the R may dissipate power and therefore needs to be sized correctly.

Very Slow CV Mode Overall

Figure 9:
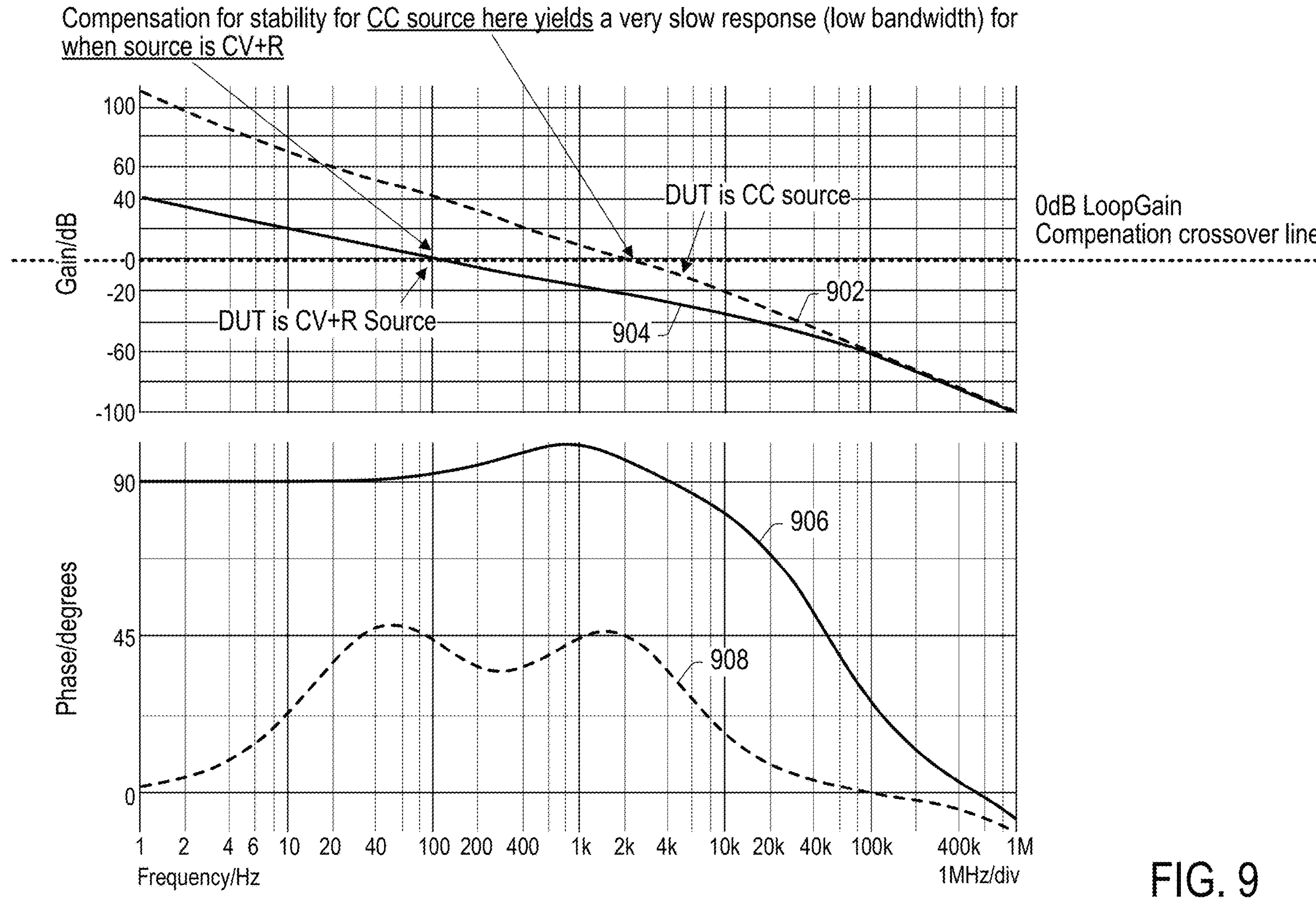
FIG. 9 shows example bode plots, respectively, for gain and phase of a system featuring compensation for CC source stability.

FIG. 9 shows example bode plots of the loop gain when the source connected to the electronic load is CC or a CV+R source. The bandwidth and response of the system is where the loop gain crosses the 0 dB line (dashed horizontal line). Crossing at a higher-frequency yields better and faster response. Because there are great differences in DC gain as well as the location of various poles and zeros, it is very difficult to obtain an optimized compensation that works for both sources types. Typically, for stability reasons the CC source (dashed lines 902, 908) may need to be compensated to balance between stability and a good response, allowing the response of the CV+R source to fall to whatever it may be, which is very slow, typically by one to two decades. As seen in FIG. 9, compensation for CC source stability yields slow performance (low bandwidth) when source is changed to CV+R.

Constant Current Mode and Cable Inductance

Figure 10:
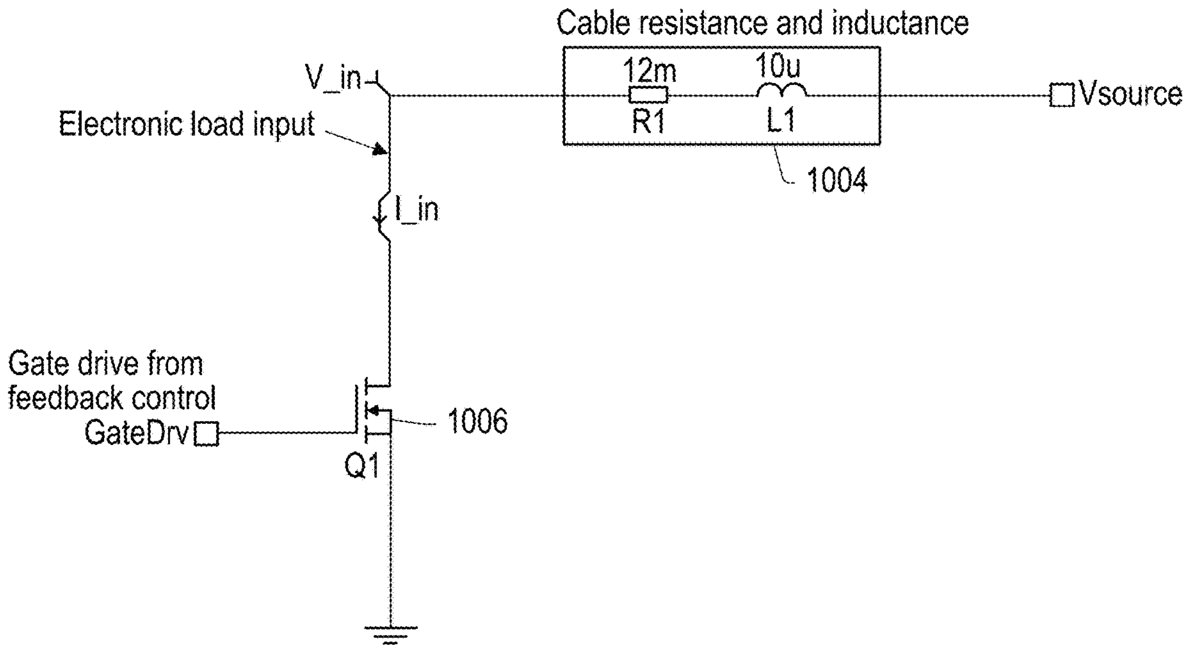
FIG. 10 shows a simplified example circuit diagram of a control element (possibly a field effect transistor) in an electronic load.
Figure 11:
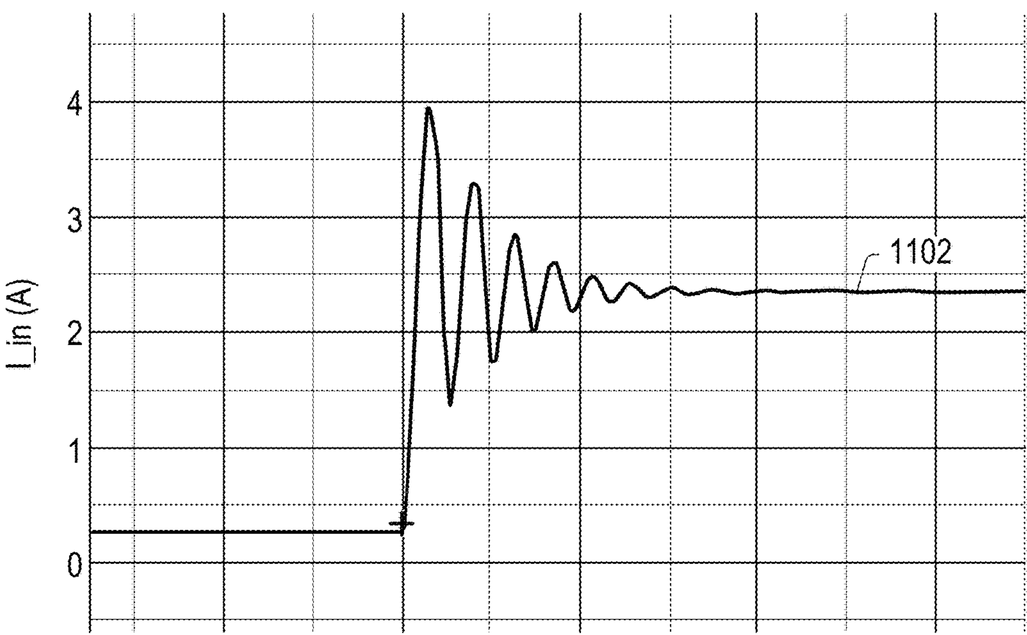
FIG. 11 shows an example signal diagram illustrating resonance in a system.

FIG. 10 shows a simplified example circuit diagram of the control element (possibly FET) in an electronic load. When the feedback control drives the FET from sourcing one current to another, this current step creates resonance due to the cable inductances and stray capacitances in the circuit, as shown in the example signal diagram of FIG. 11. These resonances are typically beyond the bandwidth of the control loop, and hence the feedback system would not be able to attenuate it.

Figure 12:
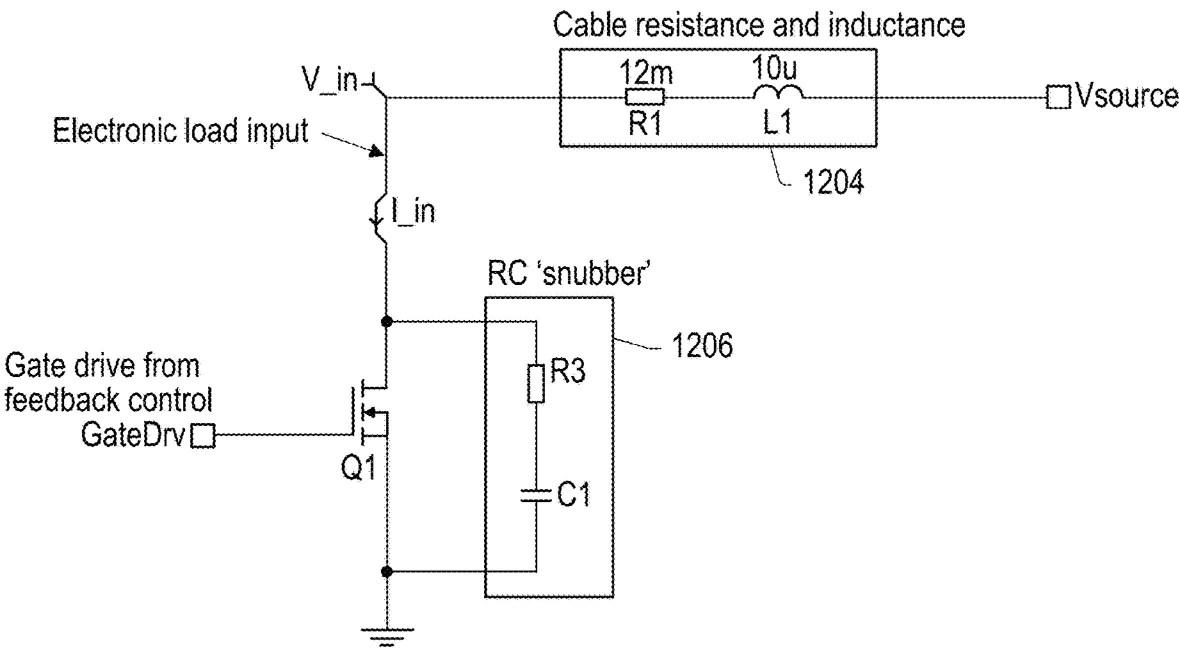
FIG. 12 shows a simplified example circuit diagram illustrating the use of a snubber circuit across the input.
Figure 13:
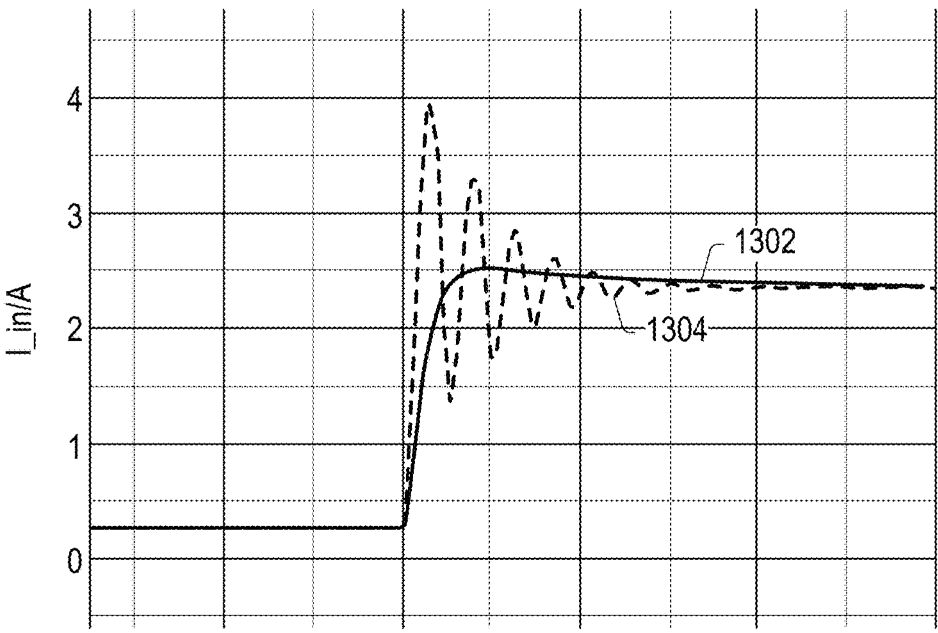
FIG. 13 shows an example signal diagram illustrating dampened resonance in a system resulting from the use of snubbers.

Typically, an electronic load may have some kind of RC snubber across the input, as shown in the example circuit diagram of FIG. 12, to reduce the Q of the system and hence dampen the ringing as illustrated in the example signal diagram of FIG. 13. The damped response is represented by the solid curve 1302.

Figure 14:
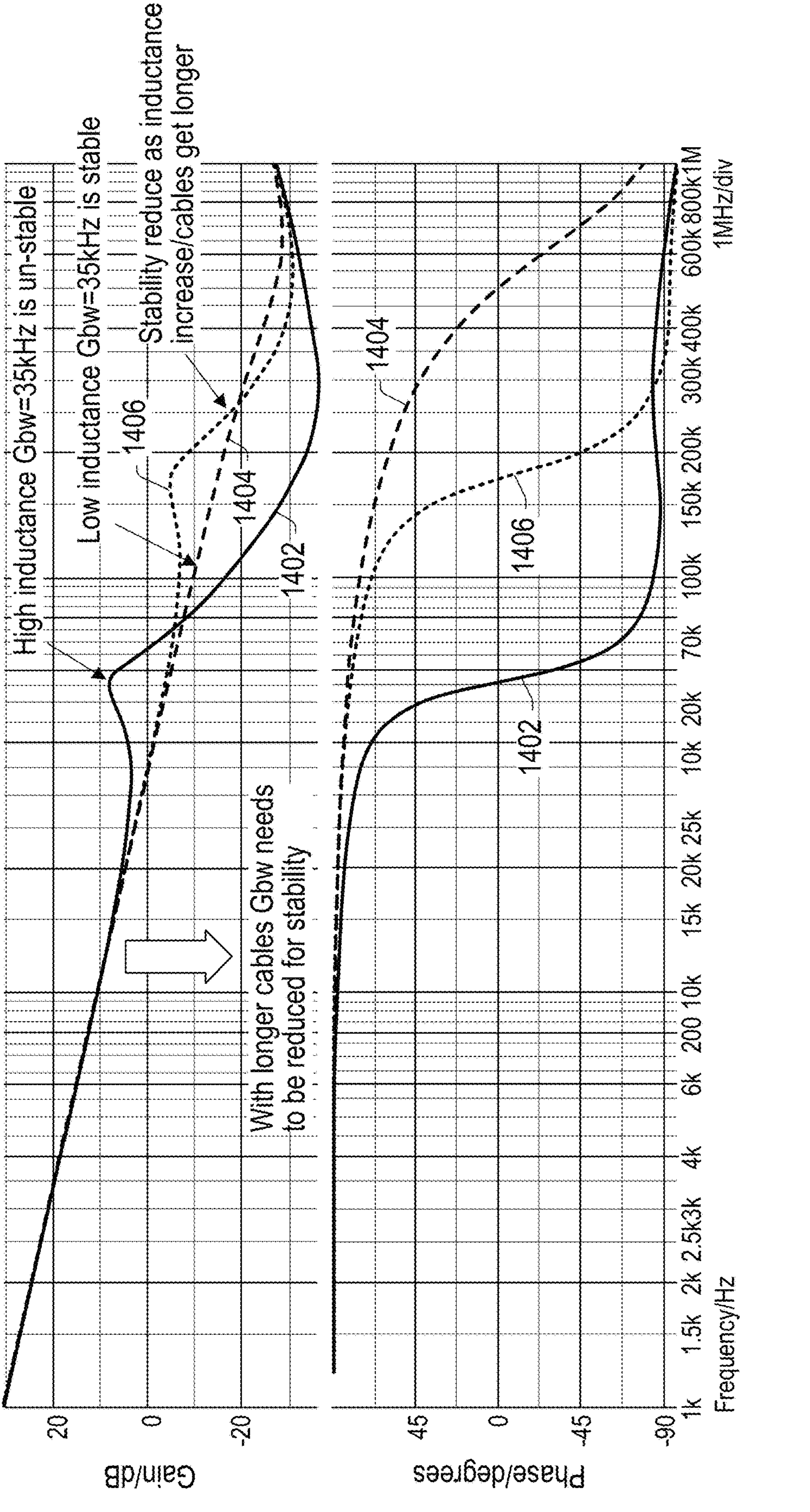
FIG. 14 shows an example bode plot of gain and phase of system when high inductance cables or long cables are used.

In the frequency domain, the cable inductance/resonance may also potentially drive the feedback into oscillation and reduce the potential bandwidth of the system. This is because, in CC mode, the cable inductance creates an LC resonance that limits the bandwidth that may be compensated for in the system, as the LC resonance peak rises above the 0 dB, which leads to instability of the overall feedback loop. As shown in the example loop gain plot in FIG. 14, if high inductance or long cables are used, especially at high currents, an LC resonance caused by the cable inductance and the input capacitance of the electric load, Eload, may be observed. This bump tends to drastically reduce the phase margin at the 0 dB crossing point, resulting in instability of the analog loop:

This stability is direct effect of the long cables/high inductance on the analog current loop.

It is especially an issue at high currents, low(er) voltage and long cables.

If a specified (considered typical) length of cable is compensated for, then performance may be unnecessarily degraded with shorter cables.

Figure 15:
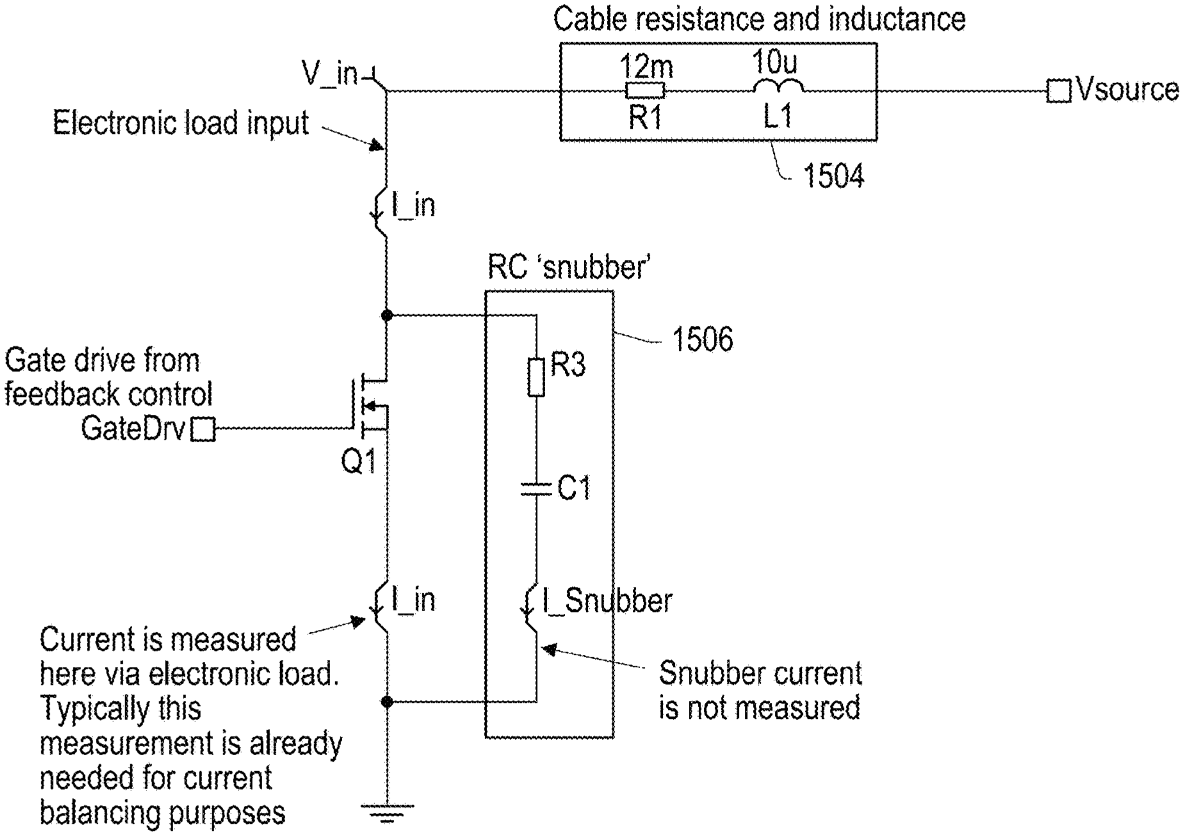
FIG. 15 shows a simplified example circuit diagram illustrating the use of snubber circuit, with input the current measured via electronic load.
Figure 16:
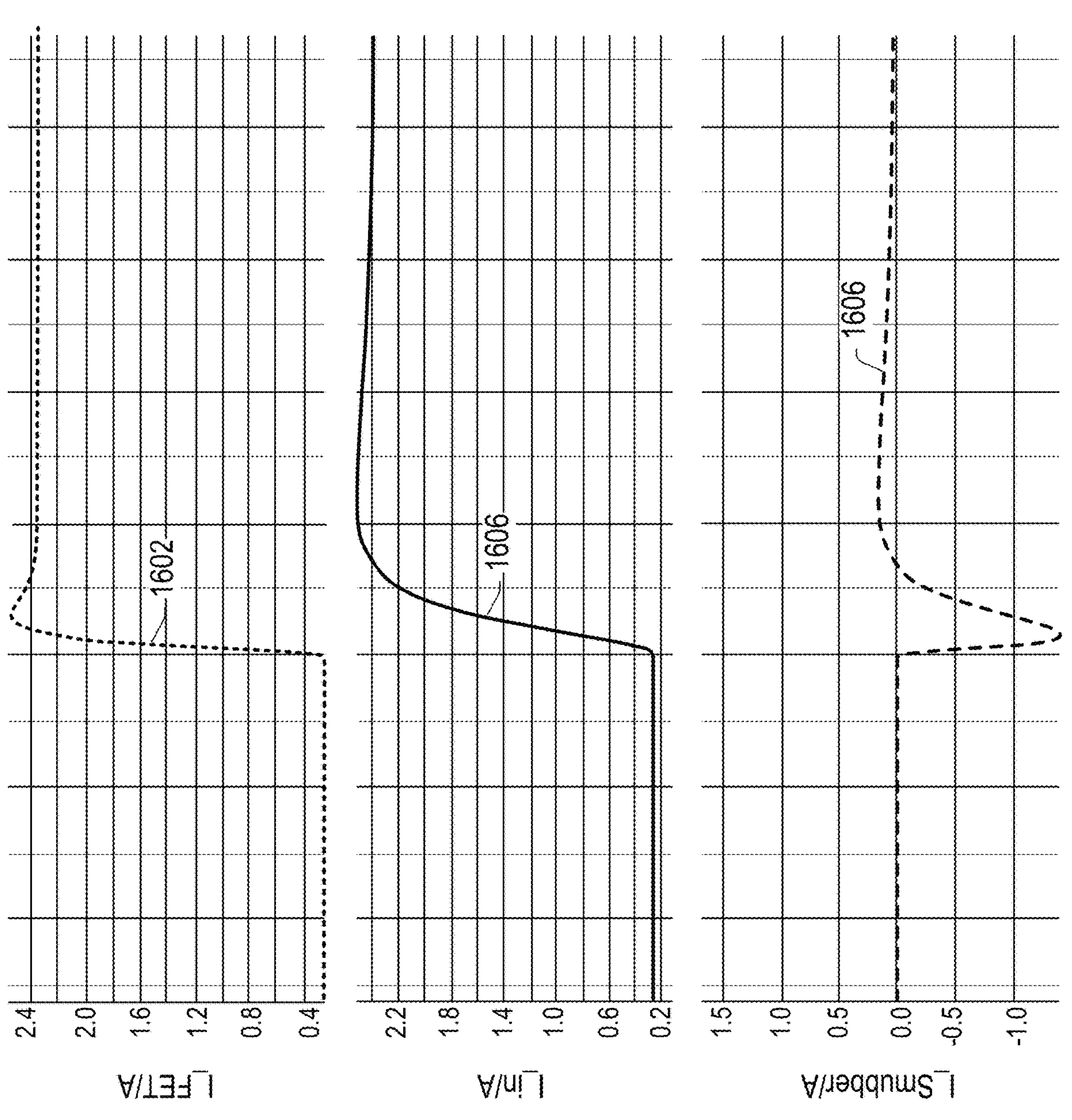
FIG. 16 shows example current diagrams illustrating various currents present in the example circuit of FIG. 15.

Although the RC snubber reduces this resonance gain, it has limited effect across different cable inductances, unless C is larger. However, a large C causes measurement distortion as the current in the control FET and snubber sums up to become the full input current. Typically, current measurement feedback may have already been obtained for each FET for current balancing purposes and control. To measure the sum of the currents, another current measurement unit may be required on the sum, which represents additional space and cost, as shown by way of the example circuit diagram in FIG. 15. The current distortion is illustrated by the example signal diagrams in FIG. 16, and may still affect the readback measurement accuracy, as the I_Fet (from Q1) is what would be actually read by the measurement unit while the actual current is I_in. In addition, the snubber may slow the transient response of the actual input current even if the response at the FET's branch, I_Fet appears fast. This is basically the 'decoupling' effect of the snubber—decoupling the cable inductance from the FET and the control feedback.

CV Mode Issues—Proposed Solution

The various solutions to the control system issues contemplated above are all characterized by the differences between the systems when a CV+R and CC source is connected to the input of the electronic load. These differences force compromises in compensation or require specific compensation for each of the source type connected. Even in the most optimized solutions currently known, the response between the two sources is still mismatched as previously shown in FIG. 9. Attempts at optimally compensating for the CC source may cause the CV+R source to produce a slower response. Attempts at optimizing for the CV+R source may cause the CC source to potentially become unstable. The curves illustrated in FIG. 9 are not static and would change in gain and crossover point depending on the regulated voltage and sourced current into the electronic load, causing complications requiring additional compromises. Additionally, with a CC source, the phase margin may not be particularly high beyond 100 Hz, which may lead to compensation with low speed/bandwidth to cater for a balance between the two different sources.

Figure 17:
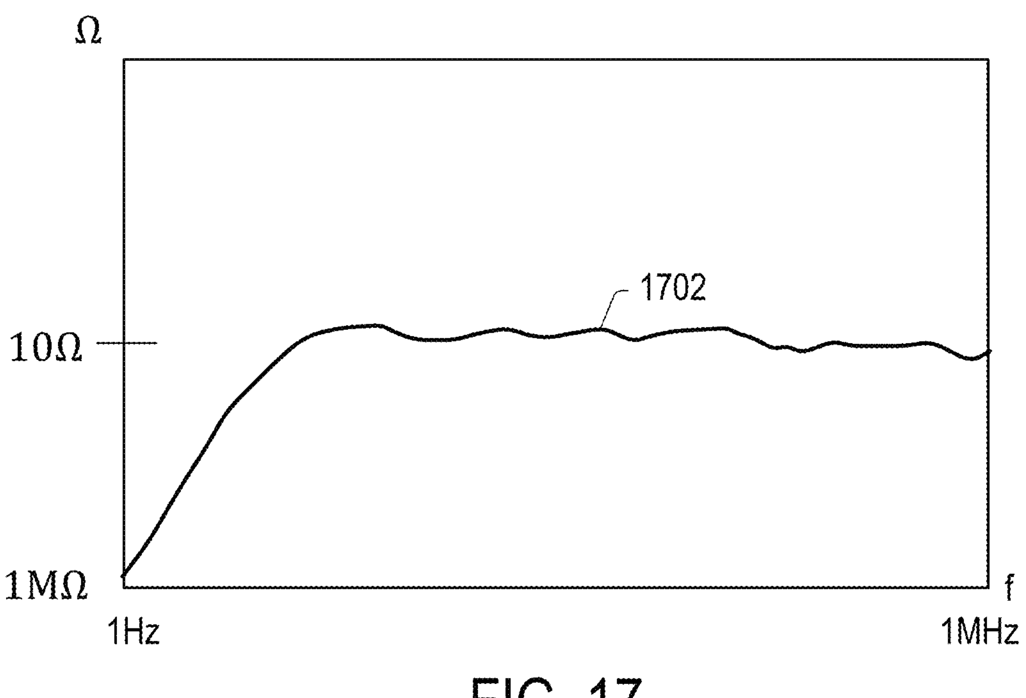
FIG. 17 shows an example plot of resistive input impedance versus frequency, according to some embodiments.

Some electronic loads allow the users to specify the type of source (e.g., CC or CV+R) that is connected and may (presumably) use this input to optimize internally. From the perspective of stability, V+R source and current source may be viewed as an inductive and capacitive, respectively. To stabilize both, we the input impedance of the Eload may need to be resistive as it may cause an additional phase shift between the current and the voltage in the circuit. This phase shift may in turn cause instability in other types of control, such as switching between CC and CV mode. In a resistive Eload, the current and voltage are in phase, so there is no phase shift and the system is more stable. This suggests a constant resistance for input impedance for Eload at high frequency, as illustrated by the example impedance diagram in FIG. 17.

From V-to-I to V-to-R

Figure 18:
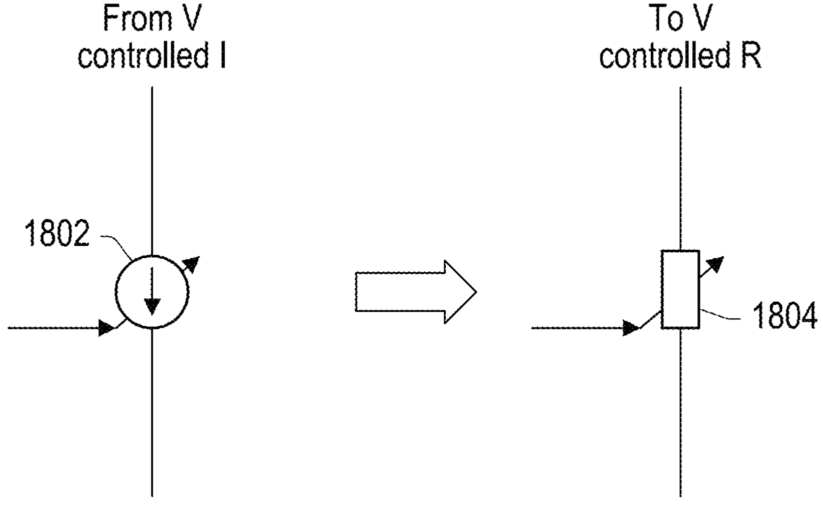
FIG. 18 shows an example circuit diagram illustrating moving from a voltage-controlled current element to a voltage-controlled resistance, according to some embodiments.

Pursuant to the above, control system response when changing from one control mode (e.g., CC control) to another control mode (e.g., CV control) may be improved by replacing a voltage controlled current source with a voltage controlled resistance/resistor source. From a time-domain perspective, the plant, or the analog section in voltage mode, may be viewed as a current source. When the DUT is also a current source, it leads to an integrator-like response that is difficult for the feedback to stabilize. However, if the current source of the analog section were replaced by resistive control, as illustrated in FIG. 18, the problem may become less severe. It should be noted that in an electronic load the same plant (control element) is retained and it is not desirable to have multiple control elements in order to cover each mode of operation, due to cost, size and complexity.

FIG. 18 shows an example circuit diagram illustrating the change from voltage-to-current (V-to-I) control to a voltage-to-resistance (V-to-R control), for example as implemented on an array board FET circuit. With a resistance as the control element, the controlled variable (voltage, in CV mode) may only be dependent on the current flowing through the element, and the voltage drop may be the same whether it is a CV+R or CC source connected across element at the input, as the voltage drop across the control element is provided as Vregulated=I×R.

Figure 19:
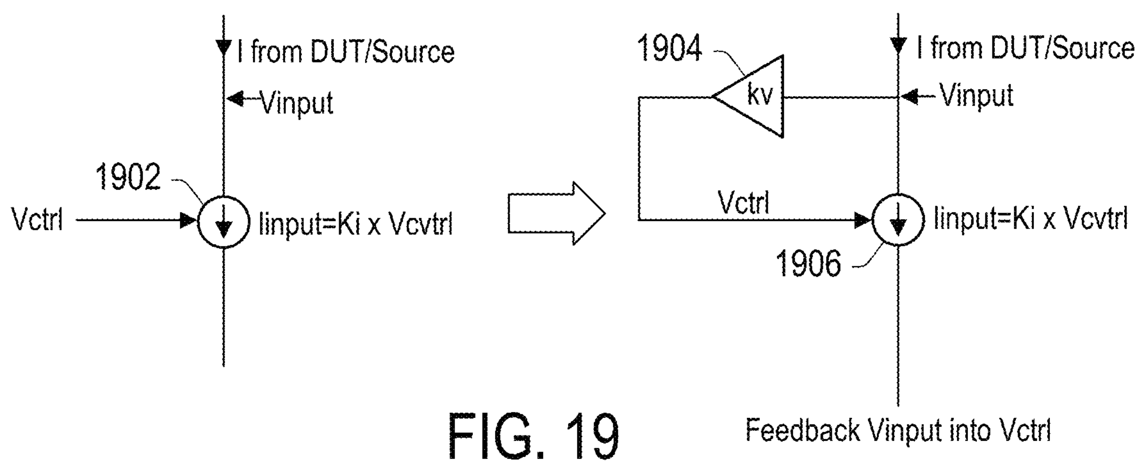
FIG. 19 shows an example circuit diagram illustrating feedback of an input voltage to a voltage-controlled current element, according to some embodiments.

FIG. 19 shows an example circuit diagram in which Vin is fed back into a V-to-I element. Specifically, the input voltage, Vinput is fed it directly into the Vctrl input of the V-to-I element (equivalent to the FETs in the electronic load). According to a simple DC analysis:

"Feedback Vinput to Vctrl"

$$Iinput = Vtrl \cdot Ki$$

$$Vinput = Kv = Vctrl$$

-continued $$\frac{Vinput}{Iinput} = \frac{1}{Kv \cdot Ki} = Rin$$

Figure 20:
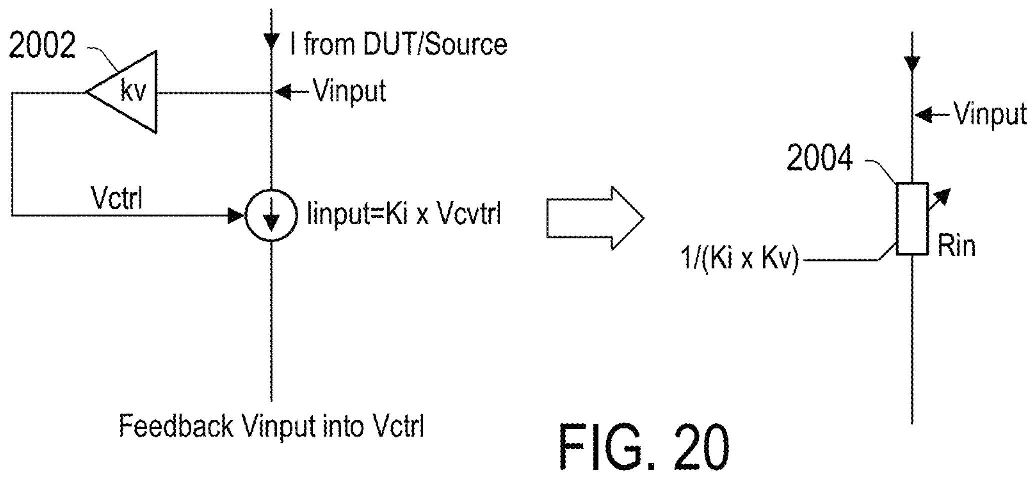
FIG. 20 shows an example circuit diagram illustrating feedback of an input voltage to a voltage-controlled current element and feedback of the input voltage to a voltage-controlled resistance, according to some embodiments.

FIG. 20 shows an example circuit diagram in which the Icontrol element is changed to an Rcontrol element. Effectively, the controlled element is now a resistor whose value depends on Ki×Kv. In other words, the resistance may be adjusted by varying Kv (or Ki).

Figure 21:
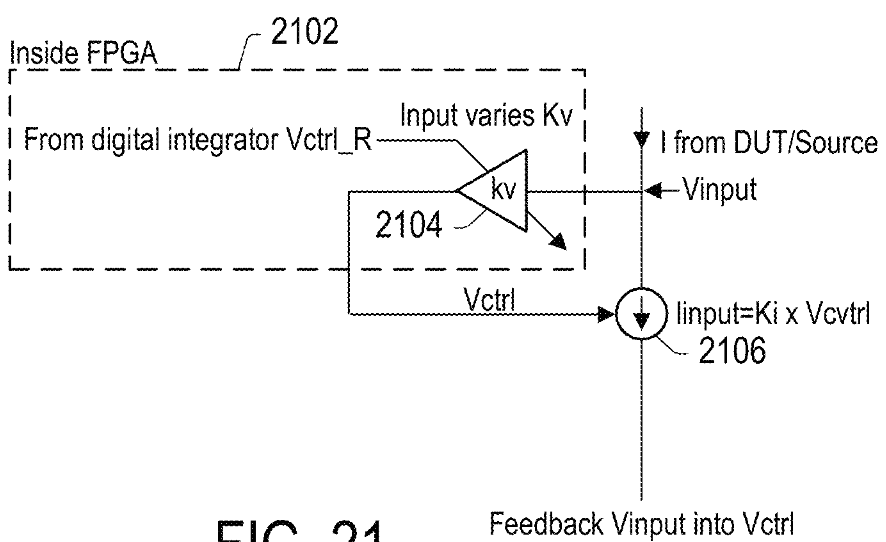
FIG. 21 shows an example circuit diagram of one implementation of a voltage-controlled resistance, according to some embodiments.

FIG. 21 shows an example circuit diagram of a potential implementation with controlled Kv gain. The Kv calculation may be performed inside an FPGA, assuming the control element is inside the FPGA. It should be noted that the FPGA implementation is one example, and in various different embodiments the control element and calculations may be implemented via other programmable means, e.g., via digital signal processing means, system on a chip, or other similar means suitable for provisioning a programmable control element.

Figure 22:
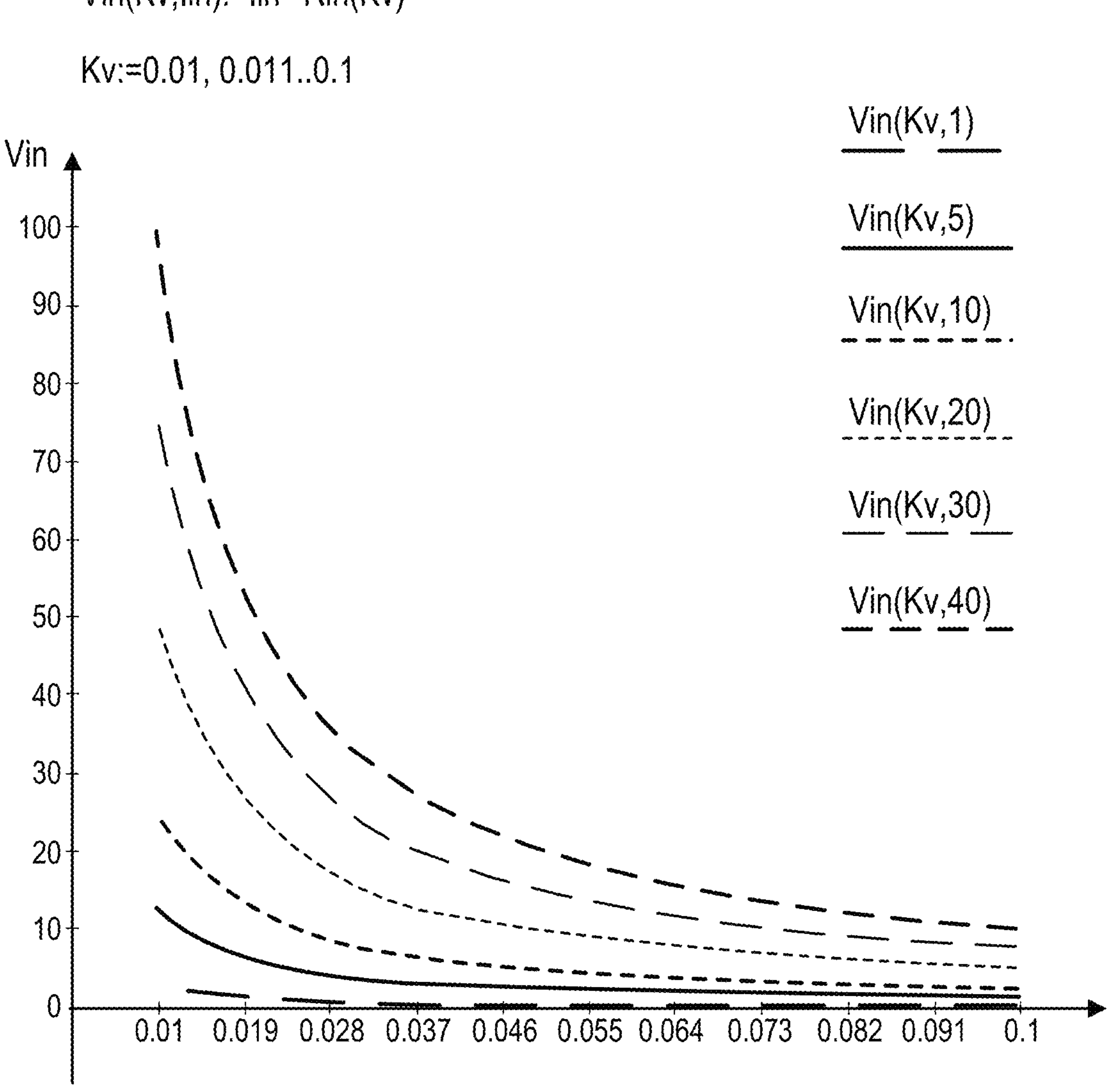
FIG. 22 shows an example voltage plot illustrating regulated input voltage vs. gain, according to some embodiments.

FIG. 22 shows an example voltage diagram illustrating regulated Vin vs Kv at different input currents, Iin. The implementation shown in FIG. 21 may yield the set of curves illustrated in FIG. 22. As observed in FIG. 22, the Kv sensitivity to the regulated voltage, Vin, varies with the input current, Iin. This results in the loop gain and flex loop response that varies with both input voltage and current in CV mode as shown in FIGS. 23 and 24.

Figure 23:
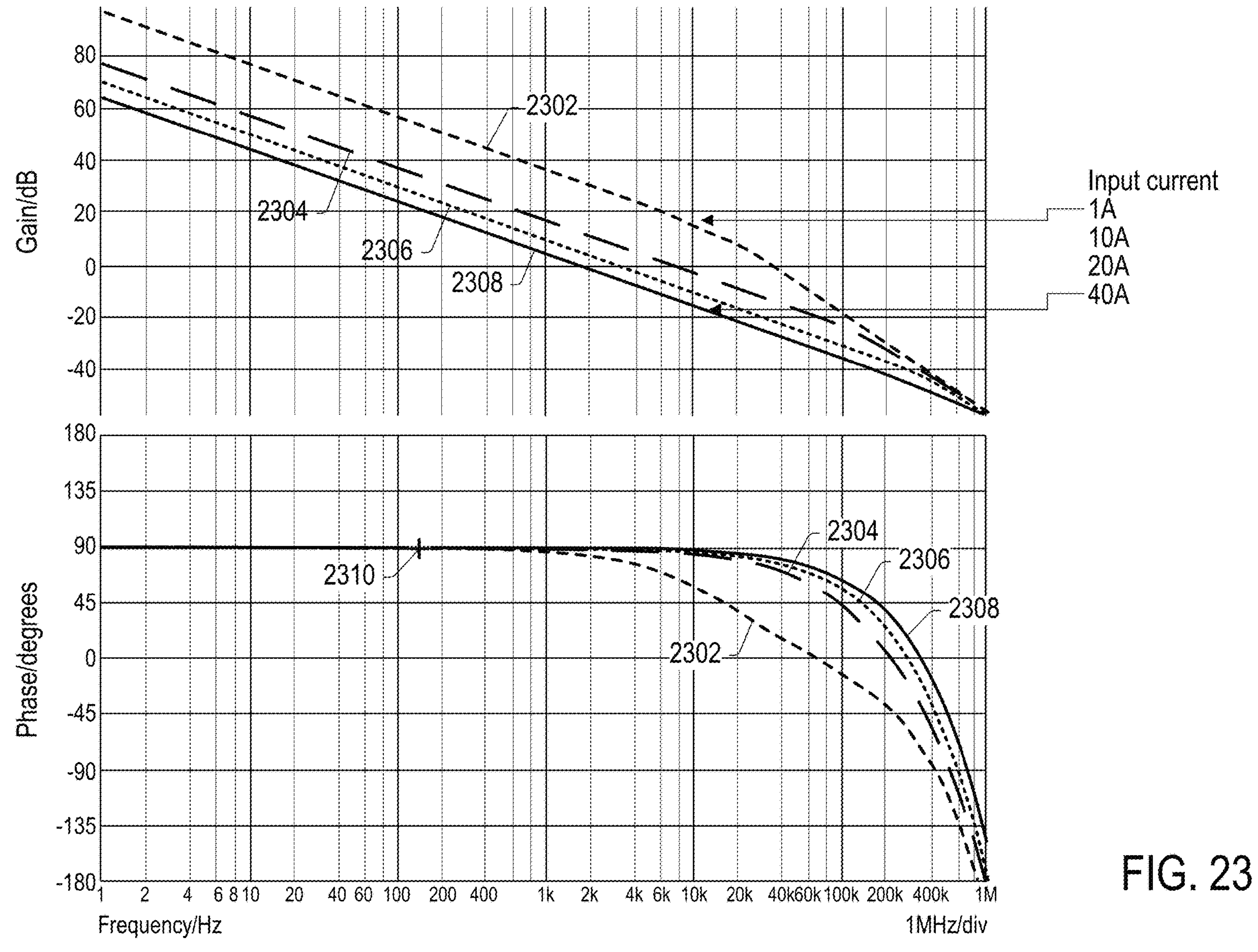
FIG. 23 shows an example bode plot illustrating how feedback loop gain varies with input current for a fixed regulated voltage, according to some embodiments.

FIG. 23 shows an example bode plot illustrating how the feedback loop gain varies with Input current (CV mode with a fixed regulated voltage).

Figure 24:
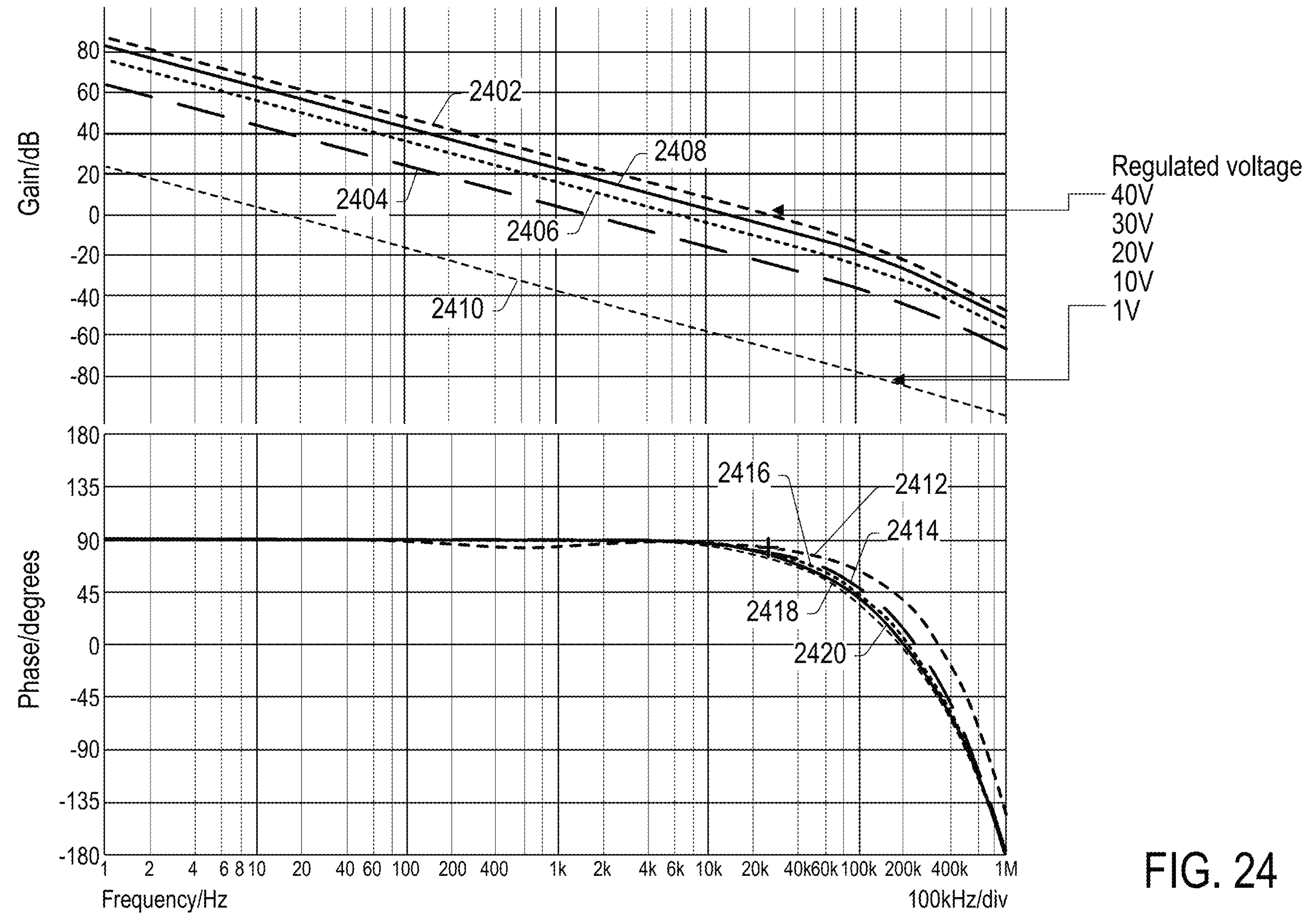
FIG. 24 shows an example bode plot illustrating how feedback loop gain varies with regulated input voltage for a fixed input current, according to some embodiments.

FIG. 24 shows an example bode plot illustrating how the feedback loop gain varies with Regulated Voltage (CV mode with a fixed input current from a CC Source).

Figure 26:
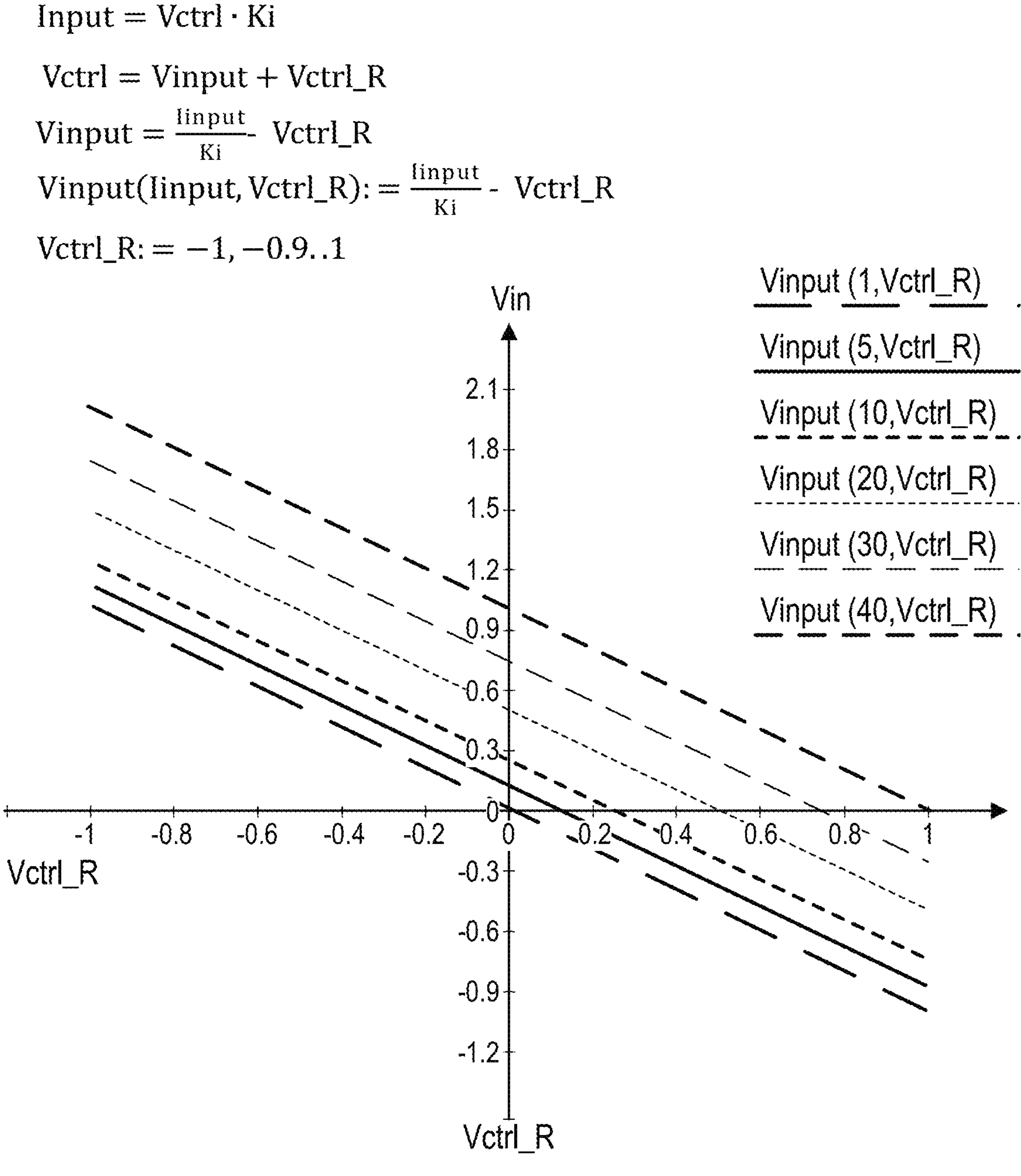
FIG. 26 shows an example plot diagram illustrating linear voltage response and constant control voltage sensitivity, according to some embodiments.

The variance and dependence of the bandwidth on the input voltage and current may be decreased by altering the equations as shown in FIG. 26.

Figure 25:
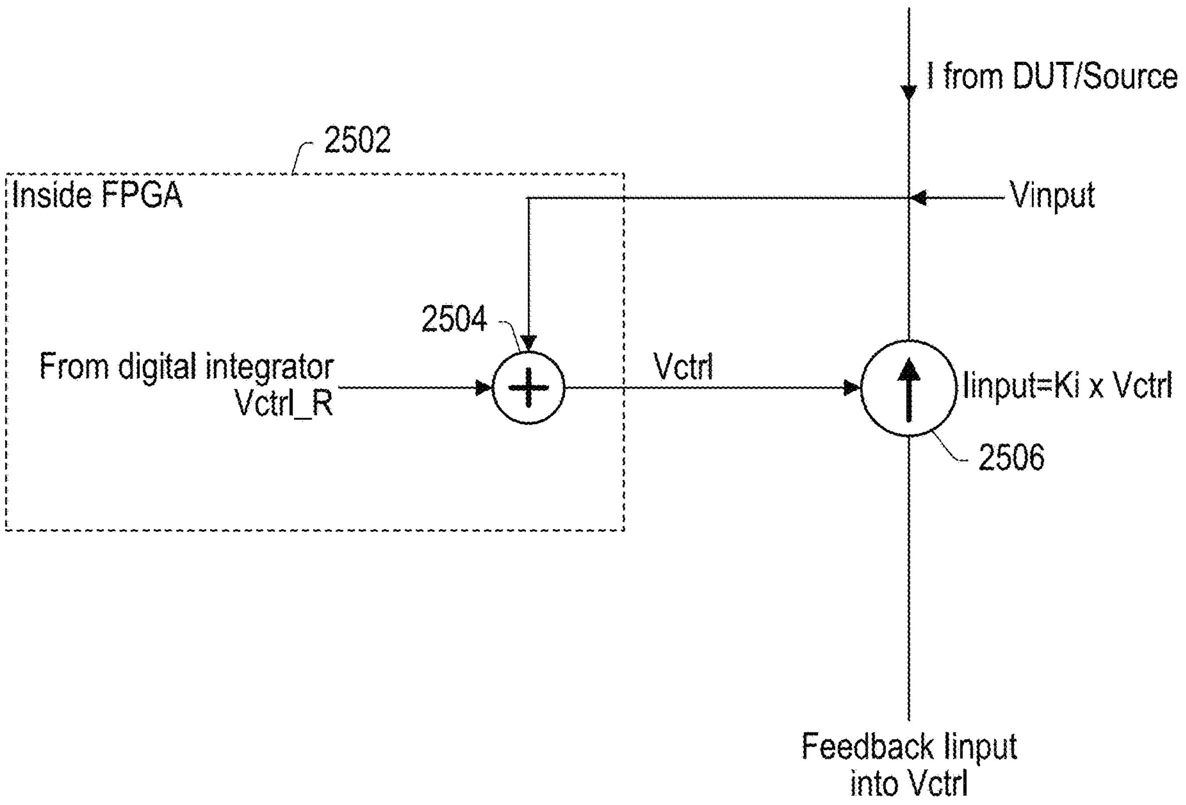
FIG. 25 shows an example circuit diagram illustrating summation-type feedback, according to some embodiments.

FIG. 25 shows an example circuit diagram illustrating summation-type feedback and Vctrl_R for Vin, and Iin invariant loop gain/gain bandwidth.

Figure 27:
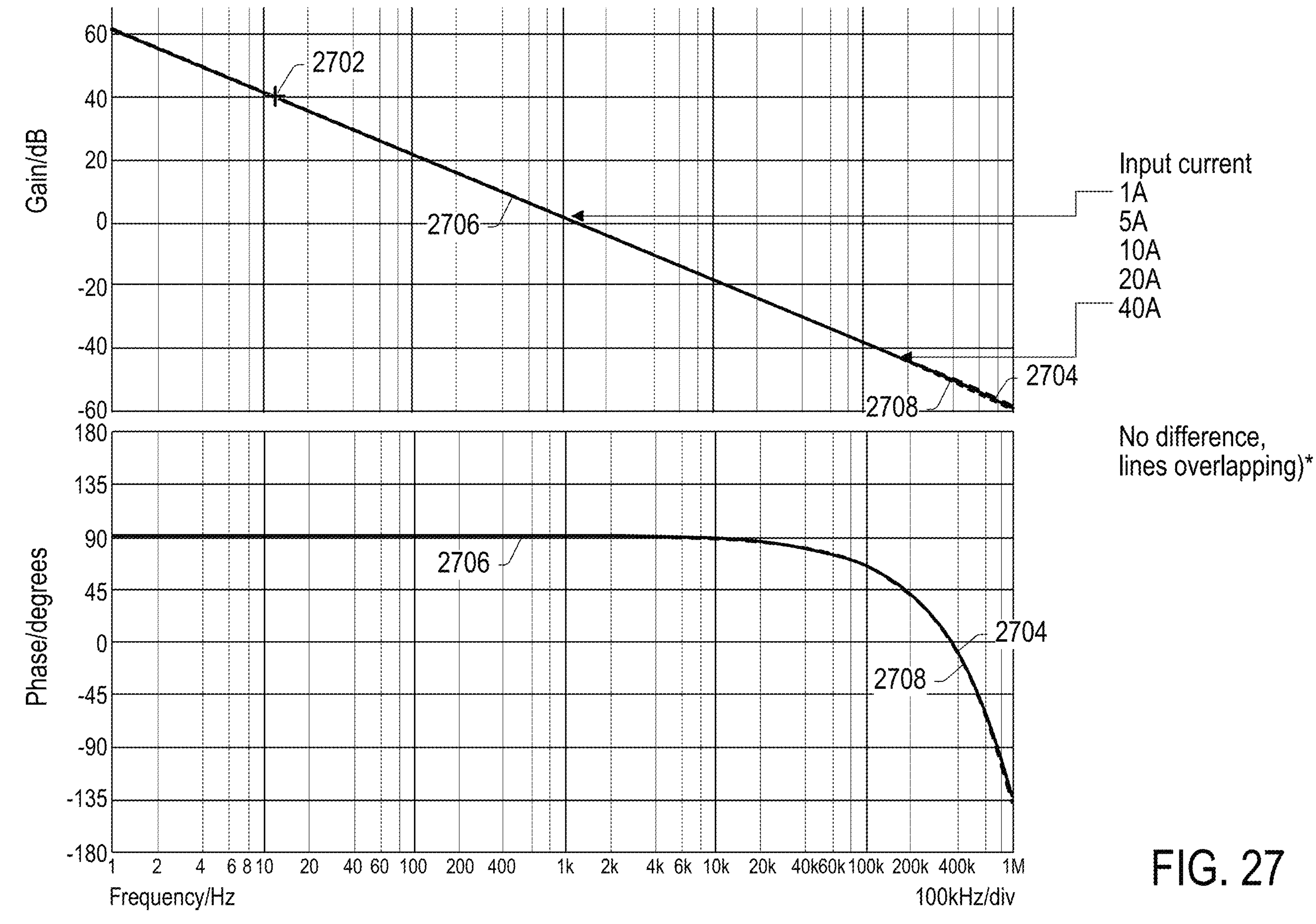
FIG. 27 shows an example bode plot illustrating non-varying feedback loop gain with input current for a fixed regulated voltage, according to some embodiments.
Figure 28:
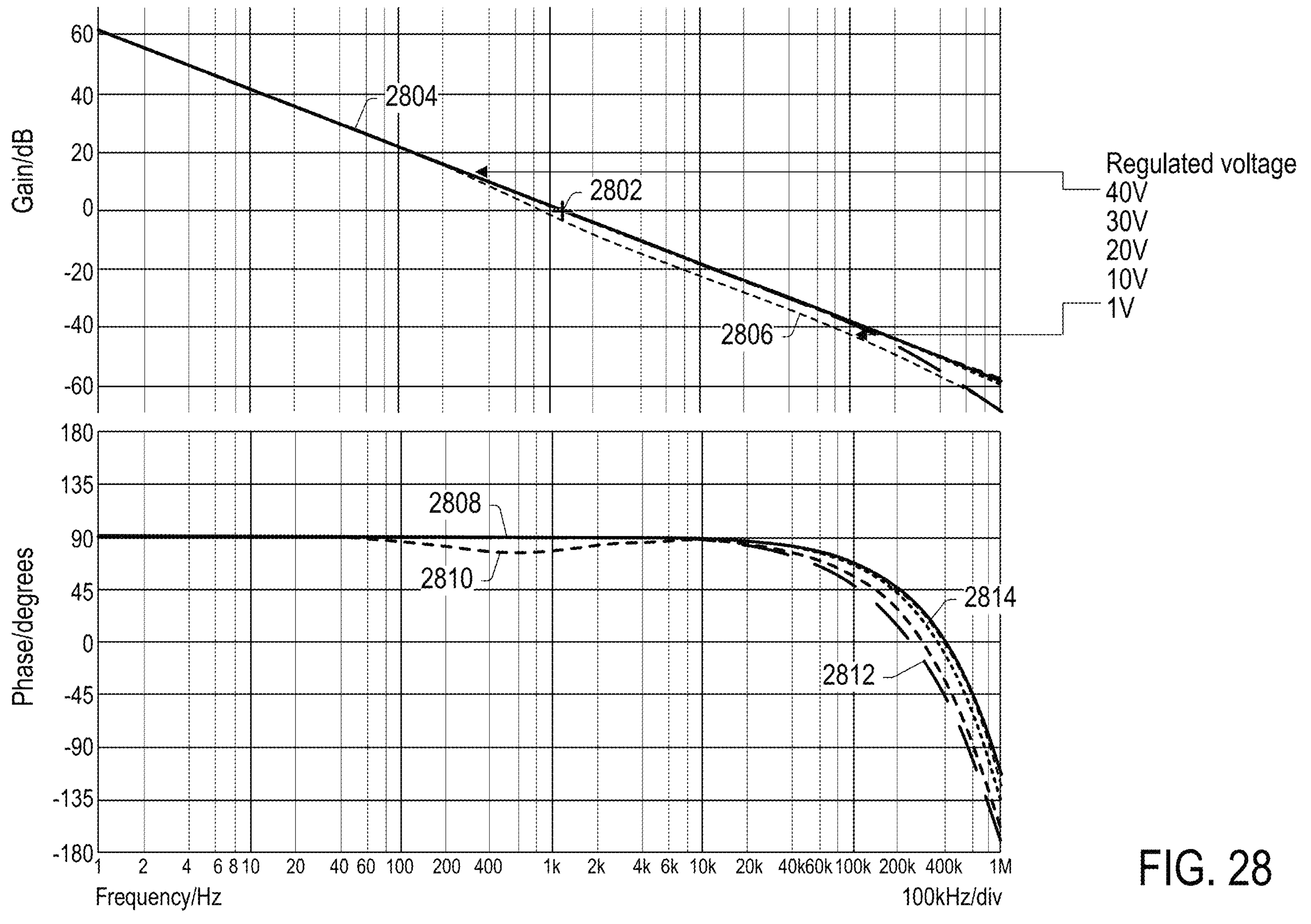
FIG. 28 shows an example bode plot illustrating non-varying feedback loop gain with regulated voltage for a fixed input current, according to some embodiments.
Figure 29:
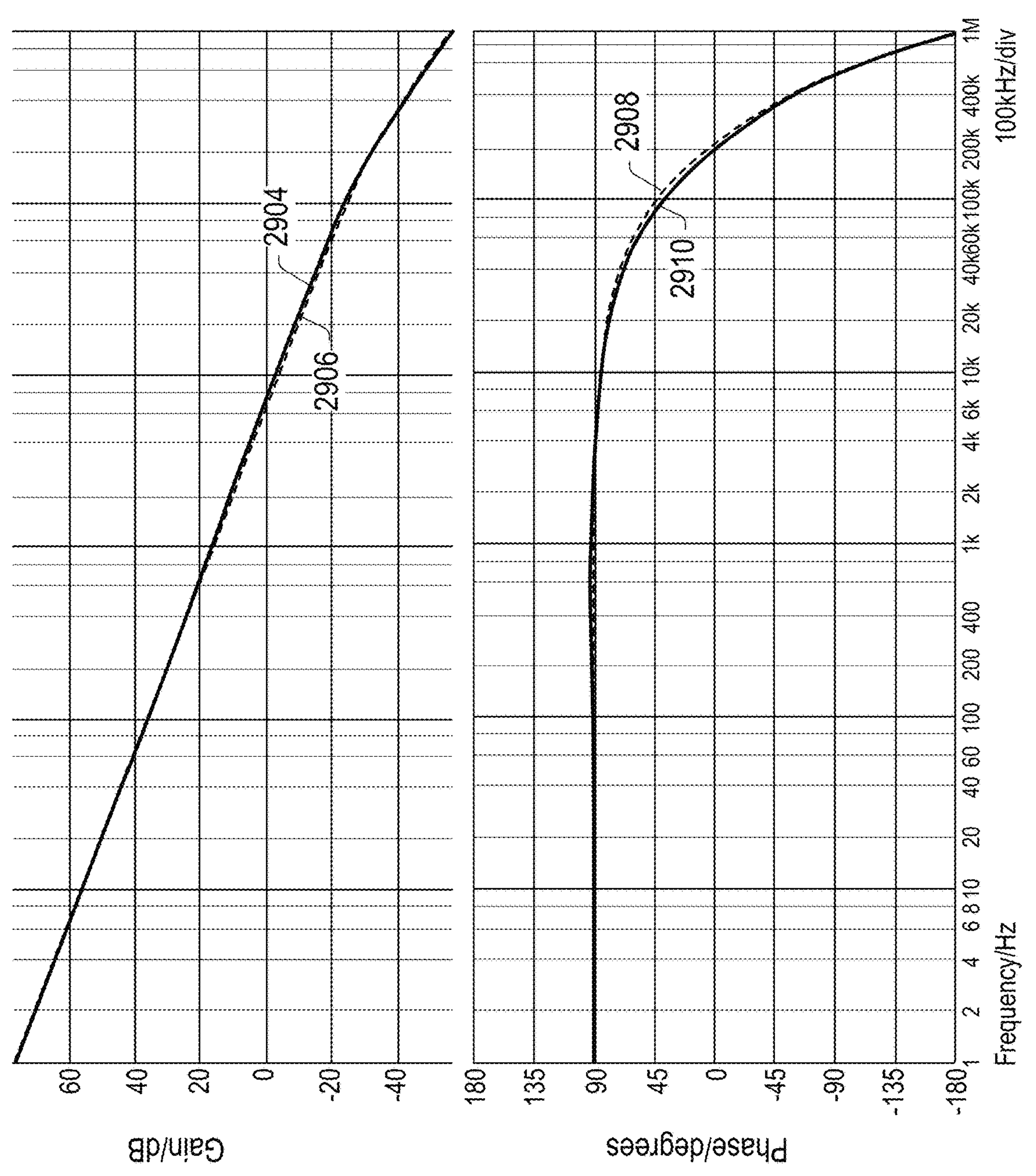
FIG. 29 shows an example bode plot illustrating the gain bandwidth/loop gain for both a CV+R source and a CC source, according to some embodiments.

FIG. 26 shows an example plot diagram illustrating linear voltage response and constant sensitivity of Vctrl_R that is independent of Vinput or Iinput. As observed in FIG. 26, in CV mode the sensitivity of Vctrl_R is a constant (gradient=constant) across the Vin and Iin operating points, resulting in gain bandwidth that does not vary significantly with input voltage or current, as also illustrated in FIGS. 27-29. This leads to a very consistent and easy to control characteristic in CV mode.

FIG. 27 shows an example bode plot illustrating that feedback loop gain does not vary with Input current (CV mode with a fixed regulated voltage).

FIG. 28 shows an example bode plot illustrating that feedback loop gain does not vary with regulated voltage (CV mode with a fixed input current from a CC Source).

FIG. 29 shows an example bode plot illustrating the gain bandwidth/loop gain and phase for both a CV+R source and a CC source. As can be seen, the gain and phase responses for CV+R and CC sources are nearly identical relative to each other and may even overlap.

As previously discussed, a primary goal has been to obtain similar loop gain characteristics for CV+R and CC sources. As evidenced above, the loop gain characteristics do appear to be nearly identical when going from a voltage-controlled current source to a voltage-controlled resistance. Consequently, similarly optimized compensation may be obtained for both types of sources. Effectively, the various embodiments of CV mode proposed herein are independent of the source type.

Figure 30:
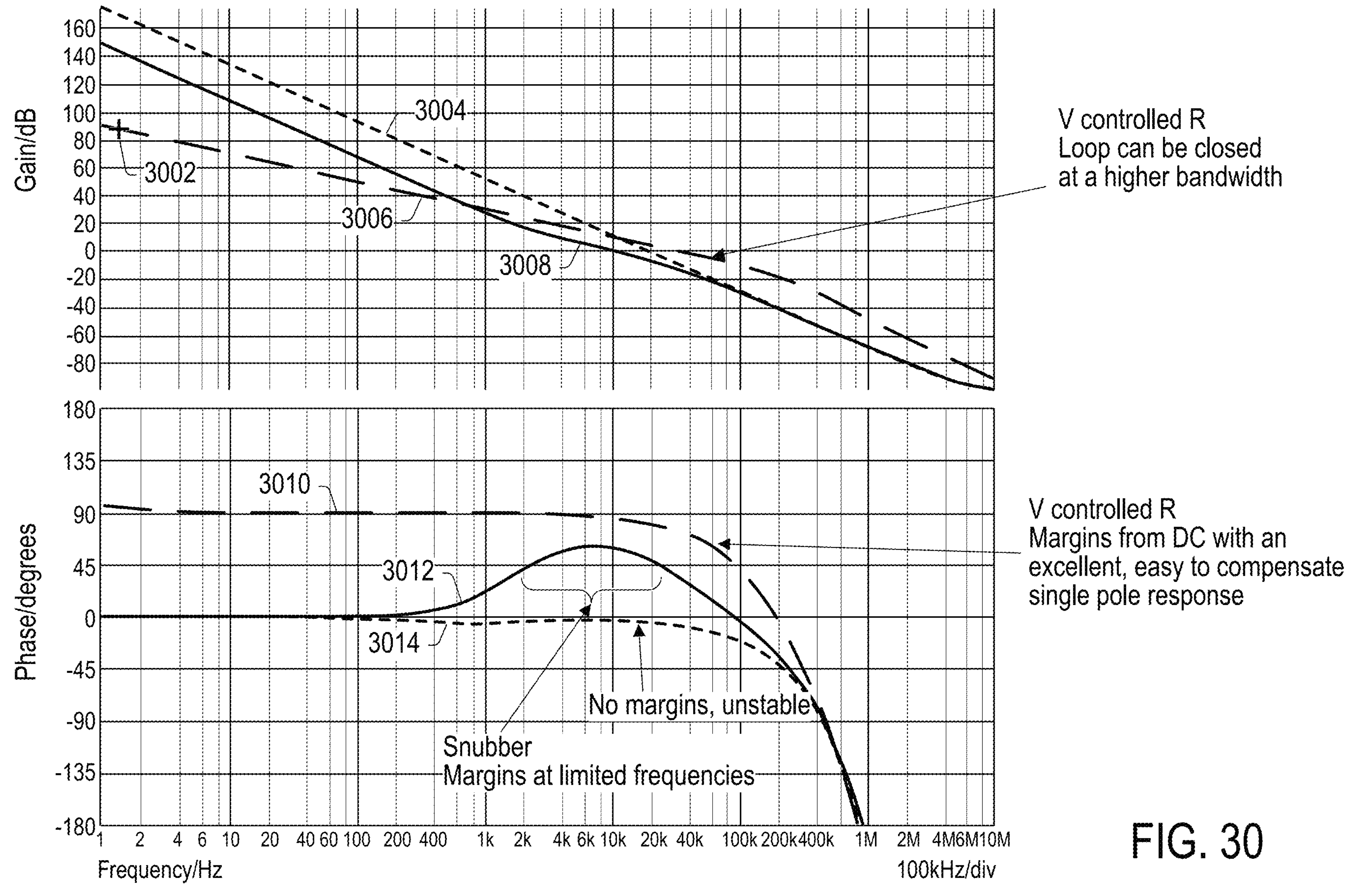
FIG. 30 shows an example bode plot illustrating the comparison of loop gain, stability, and bandwidth for different control methods, according to some embodiments.

FIG. 30 shows an example bode plot illustrating the comparison of Loop Gain, Stability and bandwidth for the different methods. Curves 3004 and 3014 are representative of a baseline approach. Curves 3008 and 3012 are representative of a baseline method with added RC snubber. Curves 3006 and 3010 are representative of the proposed voltage-controlled resistance method.

The table below lists the differences between the different methods.

| Baseline | Snubber | V controlled R (V2R) |
|---|---|---|
| 0 degrees of margins all the way due to the 40 db/dec slope of the loop gain. Can only be conditionally stabilized with additional pole zero compensation, but this will become difficult as the varying operating point changes the gain of the loopgain response. | Creates a small 'window' of frequencies that can loopgain can cross 0 dB and be stabilized. Additional margins can be improved with additional pole and zeros but similar to baseline, because of the narrow margins when operating point changes it can be destabilized. When source changes to CV + R type response will be slow. At low source currents, step response tends to saturate control loop as the C in the snubber needs to be charged resulting in a slow response as the voltage ramps up linearly depending on the source current's magnitude and the snubber values. | Simple single pole response is created which is easy to compensate. Can be compensated at a higher frequency even without additional poles and zeros, the addition of which will improve performance further. Loop response curve does not change with CV + R or CC source connected to the input of the electronic load, hence the performance for both source will be similar. |

EMBODIMENTS AND IMPLEMENTATIONS

Various analog implementations are possible and are contemplated. In some embodiments, the implementation may include a resistor divider as shown in FIG. 31, which shows an example circuit diagram of a simple resistor divider implementation. In some embodiments, differential amplifiers may be used to provide flexibility in scaling the control ranges. However, the two resistors 3106 and 3108 may provide a simple way to realize the V-to-R concept discussed above.

Figure 32:
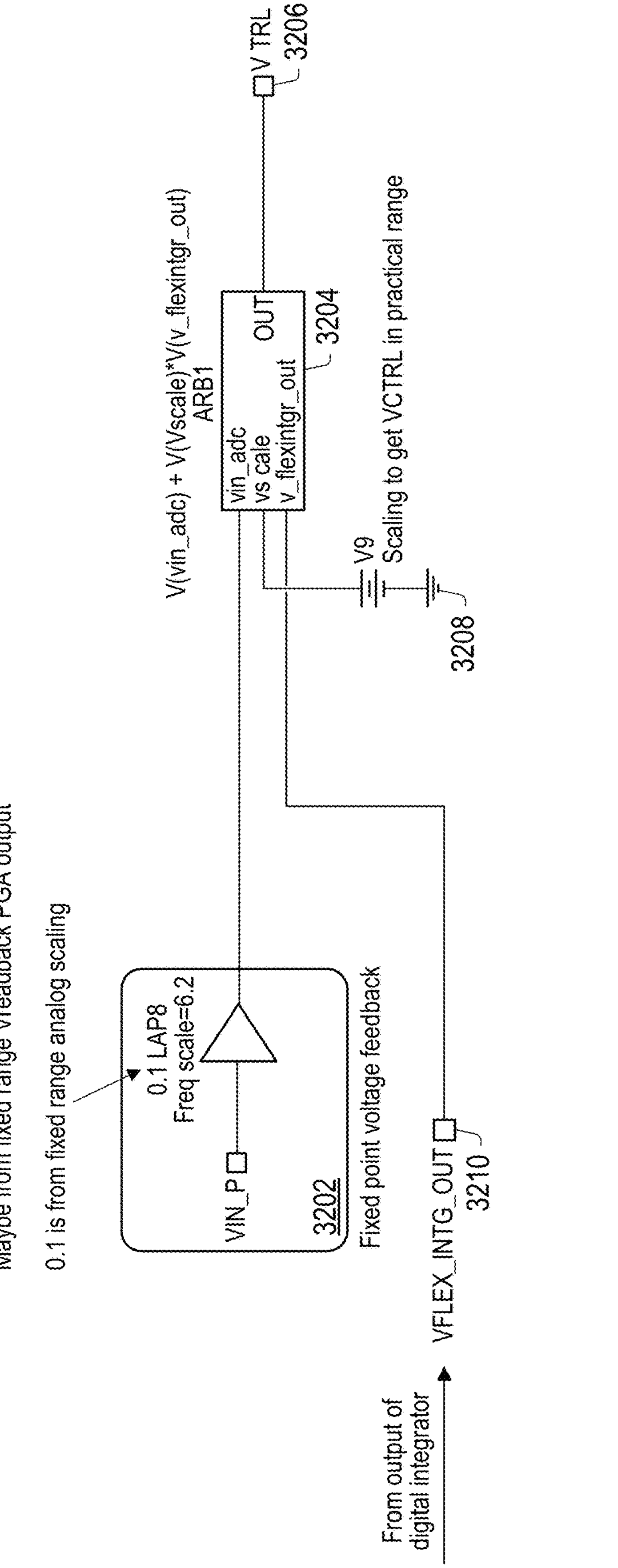
FIG. 32 shows a simplified example circuit diagram of an FPGA implementation of a voltage-controlled resistance, according to some embodiments.

Some embodiments may include an FPGA implementation as shown in FIG. 32. One aspect to consider is the processing delay, as too long of a delay may lead to instability in the V-to-R conversion.

CC Mode Improvements Using the V-to-R Method

Figure 33:
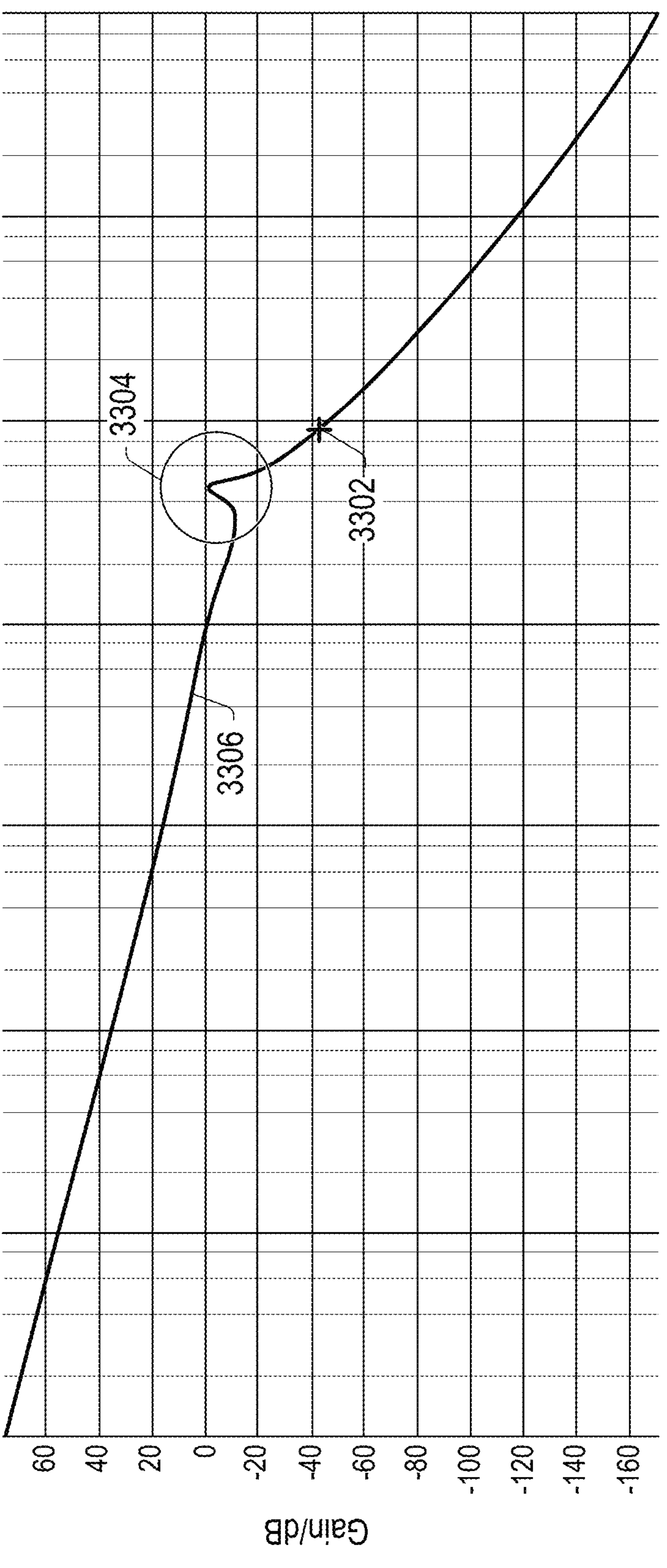
FIG. 33 shows an example bode plot illustrating LC resonance in a loop gain resulting from cable inductance.

FIG. 33 shows an example bode plot illustrating the loop gain with a typical LC resonance (circled, 3304) caused (in the loop gain) by the cable inductance. One way to use the magnitude of the LC resonance may be to reduce the resonance, Q, by adding a resistor. Because a proper resistor may cause too much current to flow across it at DC, the current may be limited to AC via a series capacitor, resulting in a snubber arrangement. This series R and C may be tuned to reduce the bump at the particular resonant frequency and at a typical estimated maximum cable length. However, in such a case the effects of a snubber used in the CV mode also need to be taken into consideration, and a compromised balance needs to be struck.

In some embodiments, instead of an RC snubber, a specific circuit arrangement may be considered. One example is shown as the circuit on the left in FIG. 34 (with a simplified functional equivalent representation provided on the right), which includes the variable resistance 3406, instead of a controlled current source, to control the current. A constant resistance 3404 may be added to limit or reduce the resonance Q. In order to not burn too much power in the constant resistance 3404, the resistance 3404 may be bypassed for lower frequencies with the inductor 3408. To ensure that the constant resistor 3404 works at the higher frequencies near the LC resonance, the FET/Control element 3406 may be bypassed via the AC bypass capacitor 3410. The circuit on the left in FIG. 34 effectively creates the virtual adjustable 'snubber' arrangement illustrated on the right in FIG. 34 with no additional components needed at the control element/plant of the electronic load. The side benefit is that the constant 'snubber' resistance is now also effectively adjustable. Another side benefit is that because the thus realized snubber system is virtual in the sense that it does not use additional resistor/capacitor parts, it does not dissipate power in the resistor like a physical snubber system.

Figure 34:
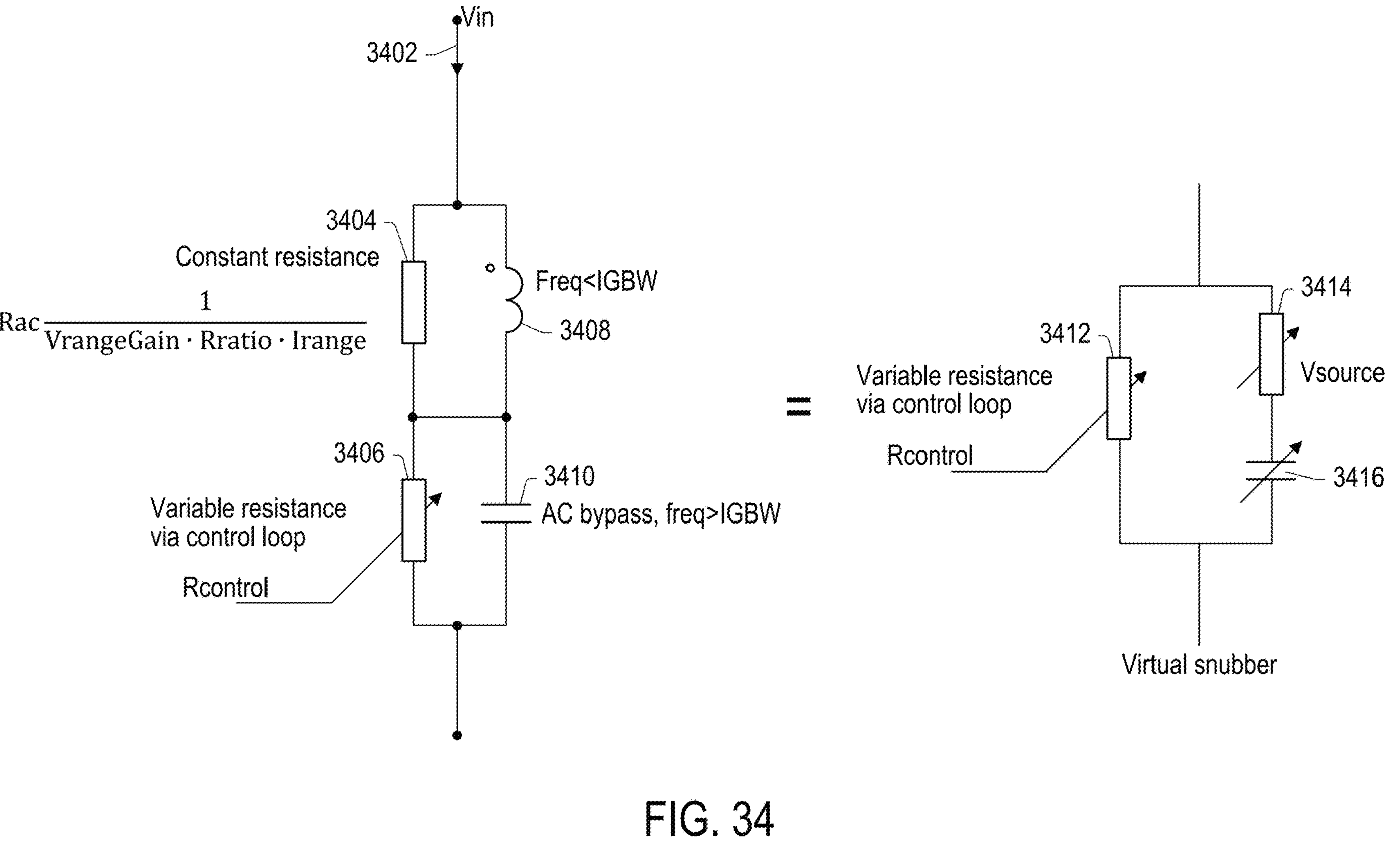
FIG. 34 shows an example circuit diagram of a replacement circuit for RC snubbers, according to some embodiments.
Figure 35:
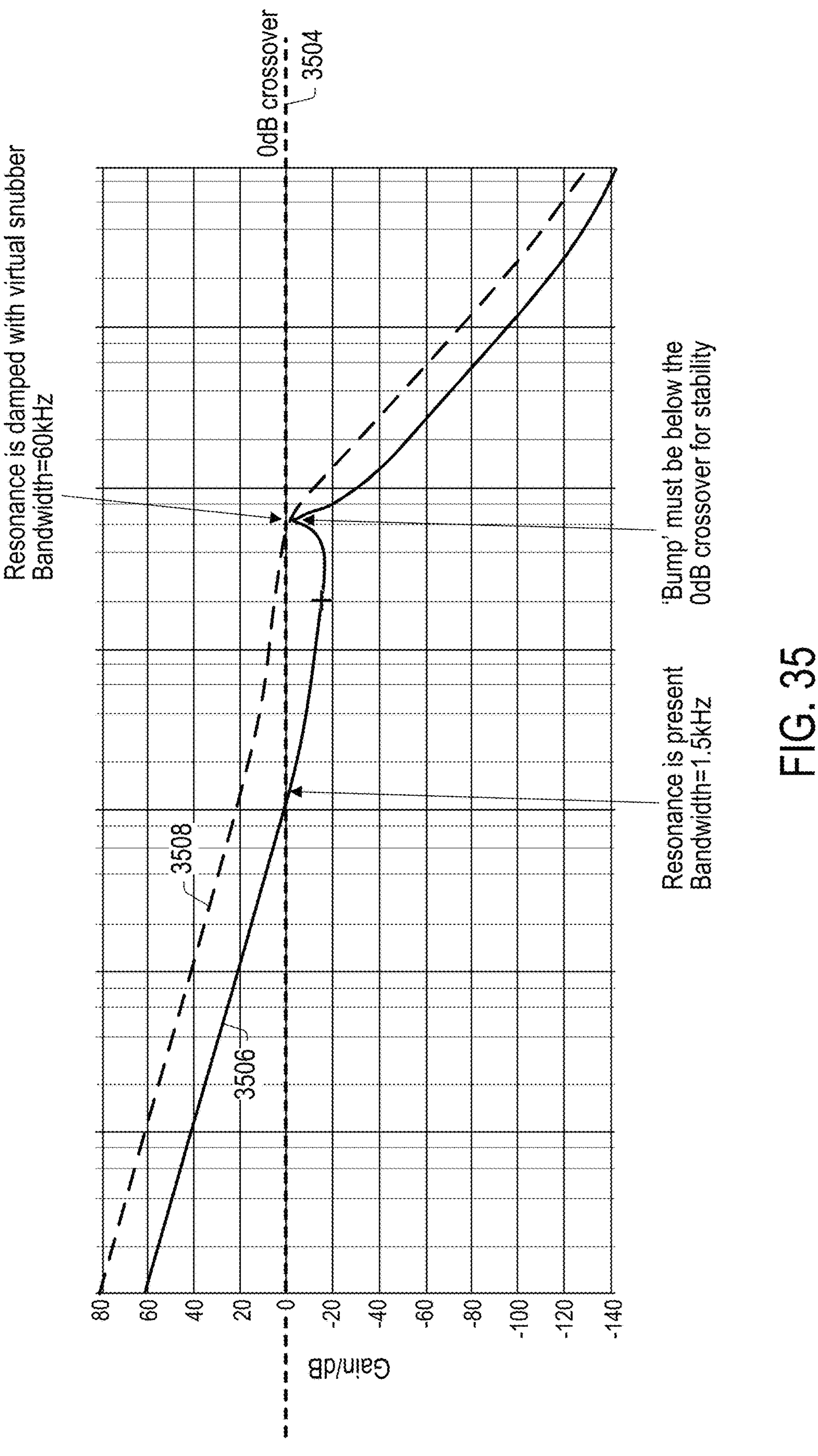
FIG. 35 shows an example bode plot illustrating the loop gain when using the circuit of FIG. 34, according to some embodiments.

As observed in FIG. 35, which shows an example bode plot illustrating the loop gain when the circuit of FIG. 34 is used, when the virtual snubber (represented by curve 3506) is turned on, the inductive resonance bump is eliminated as seen on curve 3508. This provides a means to compensate for a higher bandwidth if needed. In the example illustrated in FIG. 35, by eliminating the resonance bump, the bandwidth may improve from slightly over 1 kHz to 60 kHz.

Figure 36:
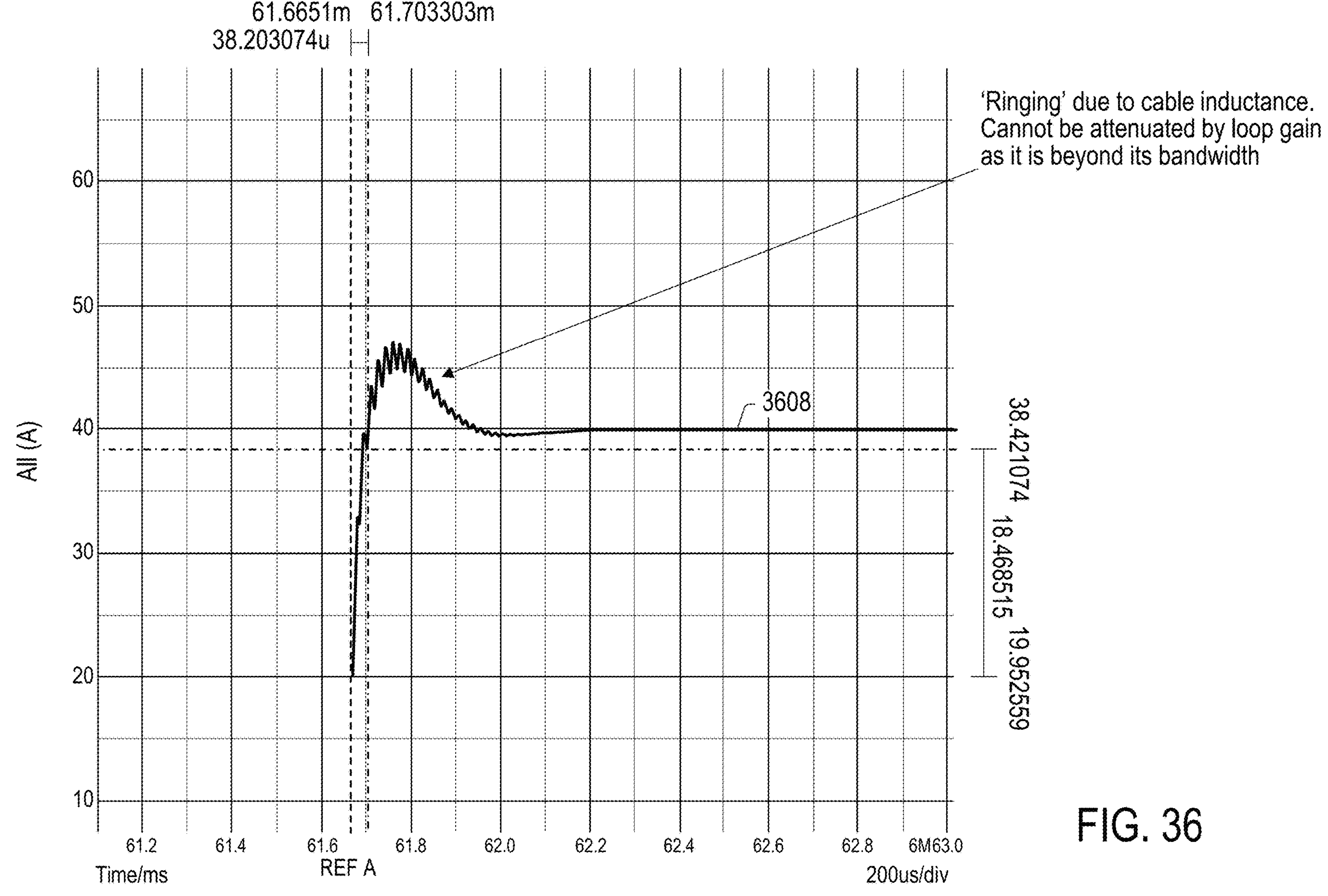
FIG. 36 shows an example signal diagram illustrating a ringing in the transient response.

FIG. 36 shows an example diagram illustrating an inductive bump from cable inductance that causes ringing in a transient response. When the cable inductance resonance is present, the transient response may exhibit a 'ringing' that cannot be compensated for by the feedback loop as is typically beyond the bandwidth. As seen in FIG. 36, the ringing is superimposed on top of the typical transient response pattern, which is still stable and with plenty of margin. One way to reduce this ringing is either with a snubber at the input to dampen the ringing, or by reducing the risetime of the step response, which would slow down the system response. The virtual snubber proposed in FIG. 34 solves this issue as well just like a normal snubber would—but without the actual physical components. In this regard, FIG. 34 shows an example of an equivalent to a snubber with adjustable frequency and resistance but without additional components in the plant of the electronic load. No additional power is dissipated. Furthermore, distortions of the current waveforms due to the snubber currents of an actual snubber have been eliminated, as all of the current that is to be measured may still flow thru the FETs and measurement shunts. This virtual snubber has the same effect on dampening of the transient ringing as well, similar to the actual physical snubber.

Figure 37:
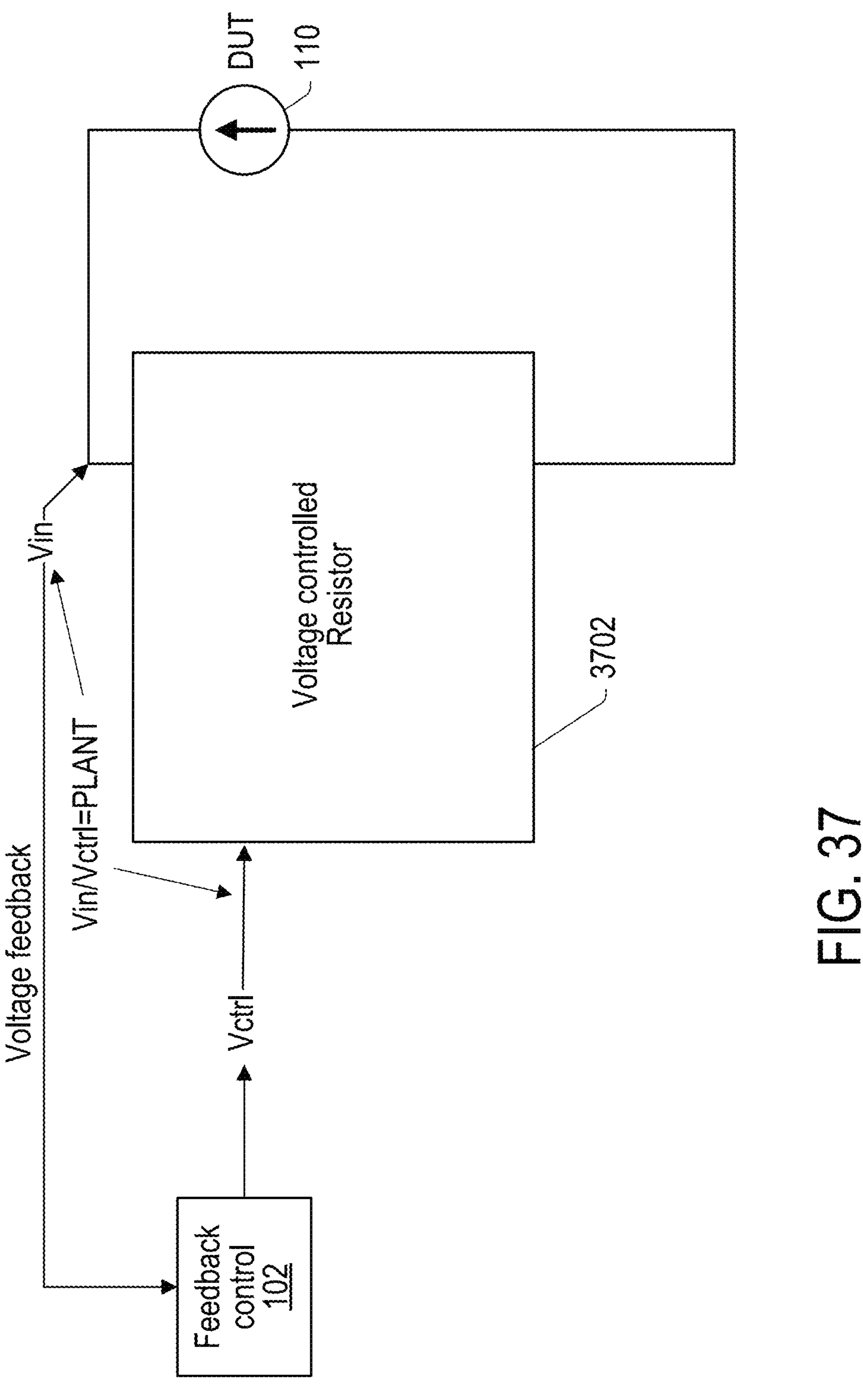
FIG. 37 shows a simplified circuit diagram of an example measurement system with a voltage-controlled resistor, according to some embodiments.

FIG. 37 shows a simplified circuit diagram of an example measurement system with a voltage-controlled resistor instead of a voltage-controlled current source/element.

Figure 38:
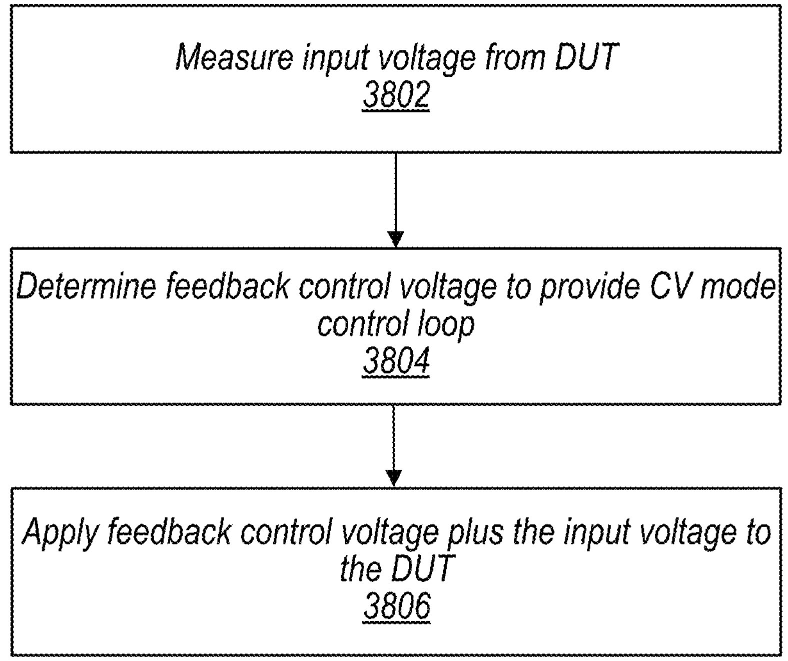
FIG. 38 is a flowchart illustrating a method for operating a DUT in a CV mode, according to some embodiments.

FIG. 38—Method Flowchart for Operating DUT in CV Mode

FIG. 38 is a flowchart diagram illustrating a method for operating a DUT in a constant voltage (CV) mode and/or a constant current (CC) mode, according to some embodiments. The method shown in FIG. 38 may be used in conjunction with any of the computer systems, battery cells, memory media or devices shown in the above Figures, among other devices.

In some embodiments, a computer system may include a processor and memory, and the memory may store program instructions executable by the processor to perform the method elements described in reference to FIG. 38. In various embodiments, the processor may be a parallel multi-processor system, a field programmable gate array (FPGA), or an application specific integrated circuit (ASIC). In various embodiments, the described method steps may be directed by a combination of the controller processor, and one or more processors of the computer system 3900 (e.g., the processor 3902). In various embodiments, some of the method elements shown may be performed concurrently, in a different order than shown, or may be omitted. Additional method elements may also be performed as desired. As shown, this method may operate as follows.

At 3802, an input voltage from a device under test (DUT) is measured. The input voltage may be measured by a measurement device that is electronically connected on either side of two terminals of the DUT. The value of the input voltage may be stored in memory. The input voltage may be measured continuously or periodically over time, such that the input voltage of the DUT may be determined as a function of time.

In some embodiments, the DUT terminals are connected to the input terminals of an electronic load (e.g., a plant). In these embodiments, the measured input voltage may be measured at the input terminals of the electronic load, and the measured input voltage may differ slightly from the exact DUT voltage due to cables, switches, and/or other components present in the electronic load. In some embodiments, the electronic load or plant may modify the voltage at its terminals depending on whether the circuit is operating in CV or CC mode (e.g., the plant typically pulls more current in CC mode). Accordingly, the measured input voltage may reflect both the native voltage across the DUT as well as a voltage contribution from the plant, where the voltage contribution from the plant may depend on the operating mode.

In various embodiments, the DUT may be a constant voltage source; a constant voltage source in series with a resistor, such as is shown in FIG. 2; or the DUT may be a constant current source such as is shown in FIG. 4.

At 3804, a feedback control voltage is determined based at least in part on the input voltage to provide a constant voltage (CV) mode control loop for the DUT. In some embodiments, determining the feedback control voltage is performed by a field-programmable gate array (FPGA). In some embodiments, determining the feedback control voltage is performed by feedback control software coupled to analog integrators. In some embodiments, determining the feedback control voltage is performed by a proportional-integral-derivative (PID) controller. A PID controller may calculate, based on the value of the input voltage over time, a discrepancy between the measured input voltage and a desired set point (e.g., in a constant voltage mode, a discrepancy between the input voltage and the set voltage of the constant voltage mode). Additionally or alternatively, the PID controller may perform similar calculations for deviations of the derivative (rate of change) of the input voltage over time and/or the integral (accumulated charge) of the input voltage over time from respective setpoints. Using these calculated discrepancies, the PID controller determines the feedback control voltage to reduce the discrepancy between the measured input voltage and the set point.

At 3806, the feedback control voltage added to the input voltage is applied to the DUT to operate the DUT in a CV mode. The feedback control voltage may be applied across the input terminals of the electronic load or plant to which the DUT is connected, in some embodiments. A circuit configured to implement step 3806 is illustrated in FIG. 25, where the input voltage (Vinput) is added to the feedback control voltage (Vctrl_R), and the sum of these two voltage values (Vctrl) is applied at block 2506 to the circuit connected to the DUT/Source. Advantageously, adding the measured input voltage to the determined feedback control voltage may provide for improved performance of the CV mode. For example, FIG. 26 illustrates how the circuit shown in FIG. 25 results in a linear voltage response and constant sensitivity of Vctrl_R that is independent of Vinput for various values of Iinput. FIG. 27 is a bode plot illustrating that the feedback loop gain for the circuit shown in FIG. 25 has a very small variance for different values of the input current.

In some embodiments, applying the feedback control voltage added to the input voltage is performed by a field-effect transistor (FET), such as a metal-oxide-semiconductor field-effect transistor (MOSFET), or another type of FET.

Advantageously, in some embodiments, applying the feedback voltage added to the input voltage to the DUT applies a controllable effective resistance to the DUT. This may enable the control system to modify the controllable effective resistance while seamlessly switching between CV mode and a constant current (CC) mode. For example, a CV mode may operate more effectively with a relatively low effective resistance, whereas a CC mode may operate more effectively with a relatively high effective resistance.

In some embodiments, the determined feedback control voltage is modified to provide a constant current (CC) mode control loop for the DUT. To operate the DUT in CC mode, the feedback control voltage may be applied to the DUT without adding the input voltage. Said another way, the determined feedback control voltage, as determined by a PID controller or another type of controller for providing a CC mode, may be applied directly without adding the input voltage. In some embodiments, while operating in CC mode the controller may measure an input current (rather than an input voltage) for use in determining the feedback control voltage to apply to maintain a constant current.

In some embodiments, a snubber is applied to reduce voltage fluctuations across the terminals of the DUT. As described in greater detail above, a snubber may reduce discrepancies between the measured input voltage and the set voltage of the CV mode.

Figure 39:
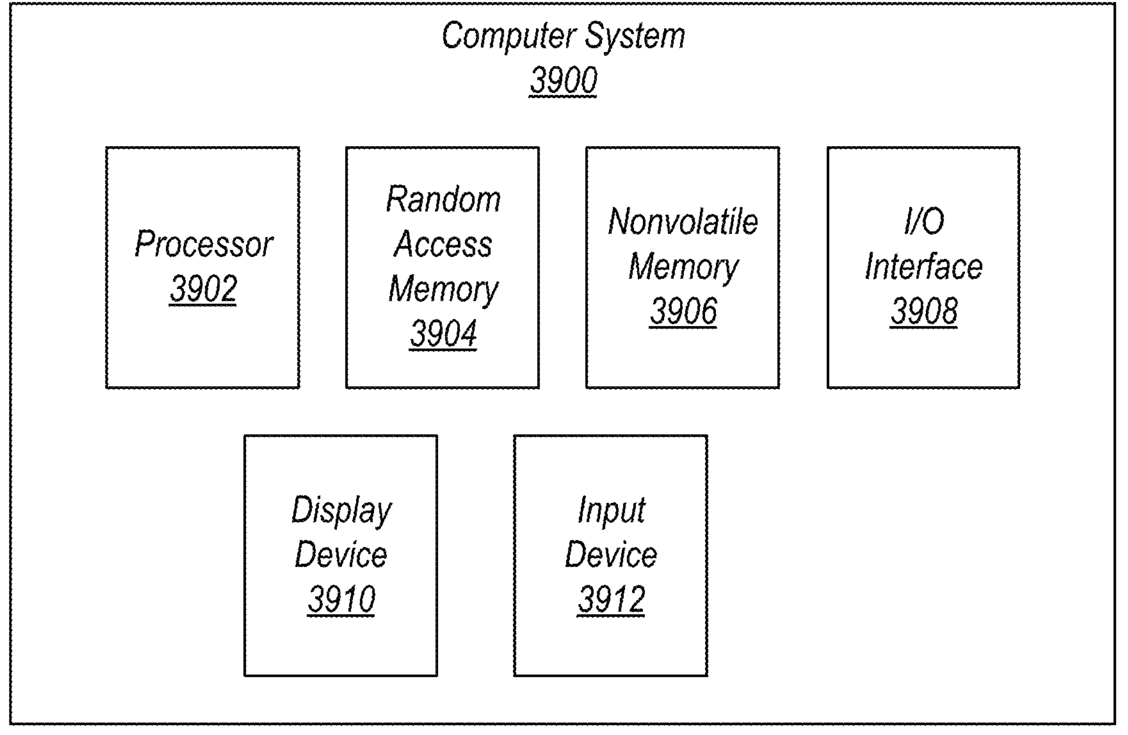
FIG. 39 is a computer system block diagram, according to some embodiments.

FIG. 39—Computer System Block Diagram

FIG. 39 illustrates a simplified block diagram of the computer system 3900. As shown, the computer system 3900 may comprise a processor 3902 that is coupled to a random access memory (RAM) 3904 and a nonvolatile memory 3906 (e.g., a computer-readable non-transitory memory medium) to implement embodiments described herein. For example, the processor may execute program instructions stored on the nonvolatile memory to control voltage across and/or current through terminals of a DUT, as described in FIG. 38, in some embodiments. In some embodiments, the processor may be a hardware-programmable processor such as a field programmable gate array (FPGA). The computer system 3900 may also comprise an input device 3912 for receiving user input (e.g., a keyboard, mouse, touchpad, etc.) and a display device 3910 for presenting output on a display. The computer system 3900 may also comprise an Input/Output (I/O) interface 3908 that is coupled to a control system to provide output/instructions to control voltage across and/or current through terminals of the DUT.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A method, comprising:
measuring an input voltage from a device under test (DUT);
determining a feedback control voltage based at least in part on the input voltage to provide a constant voltage (CV) mode control loop for the DUT;
applying the feedback control voltage added to the input voltage to the DUT to operate the DUT in a CV mode;
modifying the determined feedback control voltage to provide a constant current (CC) mode control loop for the DUT; and
applying the modified feedback control voltage to the DUT without adding the input voltage to operate the DUT in a CC mode.

2. The method of claim 1,
wherein said determining the feedback control voltage is performed by a field-programmable gate array (FPGA).

3. The method of claim 1,
wherein the DUT comprises one of:
a constant voltage source in series with a resistor; or
a constant current source.

4. The method of claim 1,
wherein determining the feedback control voltage is performed by feedback control software coupled to analog integrators, and
wherein applying the feedback control voltage added to the input voltage is performed by a field-effect transistor (FET).

5. The method of claim 4,
wherein the FET comprises a metal-oxide-semiconductor field-effect transistor (MOSFET).

6. The method of claim 1,
wherein applying the feedback voltage added to the input voltage to the DUT applies a controllable effective resistance to the DUT.

7. The method of claim 1,
wherein determining the feedback control voltage is performed by a proportional-integral-derivative (PID) controller.

8. The method of claim 1, further comprising:
applying a snubber to reduce voltage fluctuations across the terminals of the DUT.

9. A control system comprising:
a device under test (DUT) configured in a constant voltage (CV) mode control loop; and
a voltage-controlled resistor coupled in a feedback path to the DUT and configured to operate as a control element for regulating a voltage across terminals of the DUT,
wherein the voltage-controlled resistor comprises:
a measurement device configured to measure an input voltage from the DUT;

a constant voltage (CV) mode control loop configured to determine a feedback control voltage based at least in part on the input voltage, and wherein the voltage-controlled resistor is configured to:

apply the feedback control voltage plus the input voltage to the DUT to regulate the voltage across the terminals of the DUT;

modify the determined feedback control voltage to provide a constant current (CC) mode control loop for the DUT; and apply the feedback control voltage to the DUT without adding the input voltage to operate the DUT in a CC mode.

10. The control system of claim 9, wherein the voltage-controlled resistor comprises:

a measurement device configured to measure an input voltage from the DUT; and an amplifier configured to controllably modify an amplitude of the input voltage, and wherein the voltage-controlled resistor is configured to apply the amplitude-modified input voltage to the DUT to regulate the voltage across the terminals of the DUT.

11. The control system of claim 9, wherein determining the feedback control voltage is performed by a proportional-integral-derivative (PID) controller.

12. The control system of claim 9, wherein the DUT comprises one of:

a constant voltage source in series with a resistor; or a constant current source.

13. The control system of claim 9, wherein determining the feedback control voltage is performed by feedback control software coupled to analog integrators, and wherein applying the feedback control voltage added to the input voltage is performed by a field-effect transistor (FET).

14. The control system of claim 9, further comprising:

a snubber configured to reduce voltage fluctuations across the terminals of the DUT.

15. A non-transitory computer-readable memory medium comprising program instructions which, when executed by a processor, cause a control system to:

measure an input voltage from a device under test (DUT);

determine a feedback control voltage based at least in part on the input voltage to provide a constant voltage (CV) mode control loop for DUT;

apply the feedback control voltage added to the input voltage to the DUT to operate the DUT in a CV mode;

modify the determined feedback control voltage to provide a constant current (CC) mode control loop for the DUT; and apply the modified feedback control voltage to the DUT without adding the input voltage to operate the DUT in a CC mode.

16. The non-transitory computer-readable memory medium of claim 15, wherein determining the feedback control voltage is performed by a proportional-integral-derivative (PID) controller.

17. The non-transitory computer-readable memory medium of claim 15, wherein the DUT comprises one of:

a constant voltage source in series with a resistor; or a constant current source.

18. The non-transitory computer-readable memory medium of claim 15, wherein determining the feedback control voltage is performed by feedback control software coupled to analog integrators, and wherein applying the feedback control voltage added to the input voltage is performed by a field-effect transistor (FET).

19. The non-transitory computer-readable memory medium of claim 15, wherein applying the feedback voltage added to the input voltage to the DUT applies a controllable effective resistance to the DUT.

20. The non-transitory computer-readable memory medium of claim 15, wherein the program instructions are further executable to cause the control system to:

apply a snubber to reduce voltage fluctuations across the terminals of the DUT.

* * * * *